US009443597B2

United States Patent
Dutta et al.

(10) Patent No.: US 9,443,597 B2
(45) Date of Patent: Sep. 13, 2016

(54) CONTROLLING DUMMY WORD LINE BIAS DURING ERASE IN NON-VOLATILE MEMORY

(71) Applicant: SanDisk Technologies Inc., Plano, TX (US)

(72) Inventors: Deepanshu Dutta, San Jose, CA (US); Mohan Dunga, Santa Clara, CA (US); Masaaki Higashitani, Cupertino, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/669,267

(22) Filed: Mar. 26, 2015

(65) Prior Publication Data

US 2015/0200014 A1    Jul. 16, 2015

Related U.S. Application Data

(62) Division of application No. 13/479,649, filed on May 24, 2012, now abandoned.

(51) Int. Cl.
*G11C 16/16* (2006.01)
*G11C 16/14* (2006.01)
*G11C 7/10* (2006.01)
*G11C 11/56* (2006.01)
*G11C 16/04* (2006.01)

(52) U.S. Cl.
CPC ............. *G11C 16/14* (2013.01); *G11C 7/1006* (2013.01); *G11C 11/5635* (2013.01); *G11C 16/0483* (2013.01); *G11C 16/16* (2013.01)

(58) Field of Classification Search
CPC ... G11C 16/0483; G11C 16/14; G11C 16/16; G11C 11/5635
See application file for complete search history.

(56) References Cited

U.S. PATENT DOCUMENTS

| 6,052,305 A | 4/2000 | Yang et al. |
| 6,987,696 B1 | 1/2006 | Wang et al. |
| 7,430,138 B2 | 9/2008 | Higashitani |
| 7,583,535 B2 | 9/2009 | Sekar et al. |

(Continued)

OTHER PUBLICATIONS

International Search Report & the Written Opinion of the International Searching Authority dated Jul. 11, 2013, International Application No. PCT/US2013/039209.

(Continued)

*Primary Examiner* — Douglas King
(74) *Attorney, Agent, or Firm* — Vierra Magen Marcus LLP

(57) ABSTRACT

A technique for erasing non-volatile memory such as a NAND string which includes non-user data or dummy storage elements. The voltages of the non-user data storage elements are capacitively coupled higher by controlled increases in an erase voltage which is applied to a substrate. The voltages are floated by rendering a pass gate transistor in a non-conductive state, where the pass gate transistor is between a voltage driver and a non-user data storage element. Voltages of select gate transistors can also be capacitively coupled higher. The substrate voltage can be increased in steps and/or as a continuous ramp. In one approach, outer dummy storage elements are floated while inner dummy storage elements are driven. In another approach, both outer and inner dummy storage elements are floated. Write-erase endurance of the storage elements is increased due to reduced charge trapping between the select gates and the dummy storage elements.

20 Claims, 15 Drawing Sheets

(56) References Cited

U.S. PATENT DOCUMENTS

| | | |
|---|---|---|
| 7,778,086 B2 | 8/2010 | Yu et al. |
| 7,881,114 B2 | 2/2011 | Park et al. |
| 7,924,622 B2 | 4/2011 | Lee et al. |
| 7,974,130 B2 | 7/2011 | Nakamura et al. |
| 7,983,078 B2 | 7/2011 | Higashitani |
| 8,004,900 B2 | 8/2011 | Dutta et al. |
| 8,130,551 B2 | 3/2012 | Oowada et al. |
| 2009/0097326 A1 | 4/2009 | Park et al. |
| 2010/0259987 A1 | 10/2010 | Lee et al. |
| 2011/0149659 A1 | 6/2011 | Goda et al. |
| 2011/0199825 A1 | 8/2011 | Han et al. |
| 2012/0051136 A1 | 3/2012 | Kang et al. |
| 2013/0083599 A1* | 4/2013 | Nam .................. G11C 16/14 365/185.11 |
| 2013/0314995 A1 | 11/2013 | Dutta et al. |
| 2013/0329496 A1* | 12/2013 | Lee .................. G11C 16/3445 365/185.11 |

OTHER PUBLICATIONS

Restriction Requirement dated Jul. 14, 2014, U.S. Appl. No. 13/479,649, filed May 24, 2012.
Response to Restriction Requirement dated Jul. 29, 2014, U.S. Appl. No. 13/479,649, filed May 24, 2012.
Non-final Office Action dated Aug. 25, 2014, U.S. Appl. No. 13/479,649, filed May 24, 2012.
Response to Office Action dated Nov. 25, 2014, U.S. Appl.. No. 13/479,649, filed May 24, 2012.
International Preliminary Report on Patentability dated Nov. 25, 2014, International Application No. PCT/US2013/039209.
Final Office Action dated Jan. 28, 2015, U.S. Appl. No. 13/479,649, filed May 24, 2012.
European Office Action dated Jan. 23, 2015, European Patent Application No. 13722235.2.
Response to Office Action dated Jul. 31, 2015, European Patent Application No. 13722235.2.

* cited by examiner

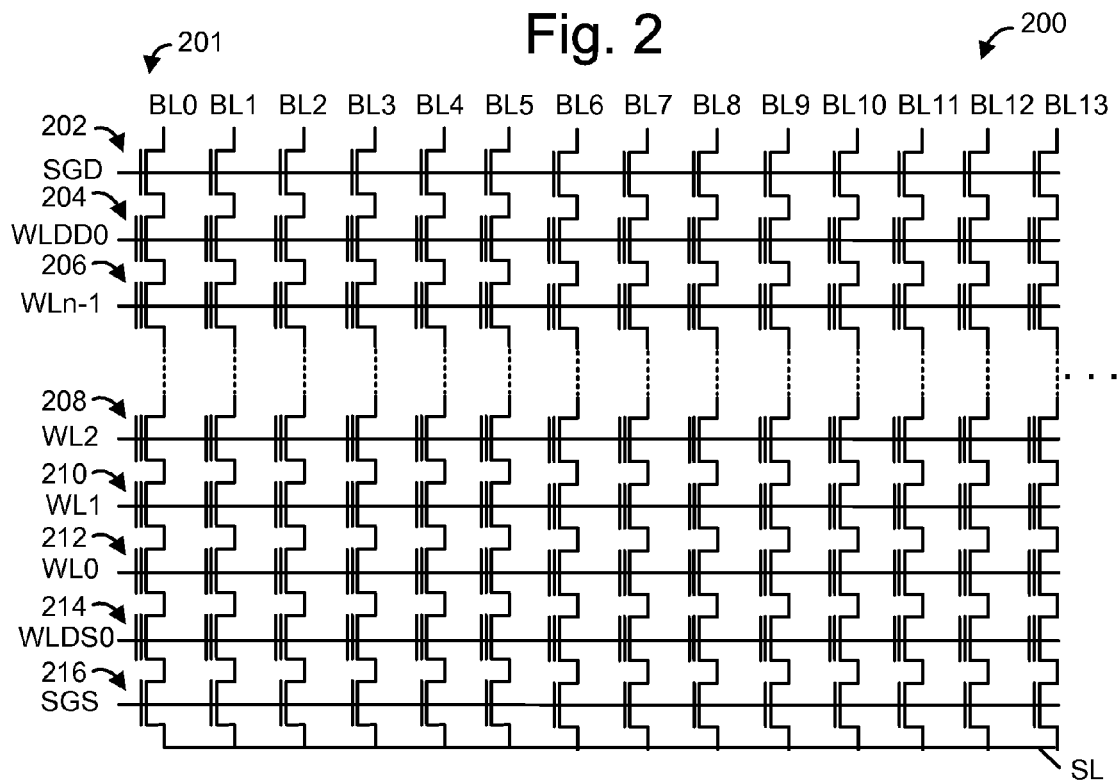
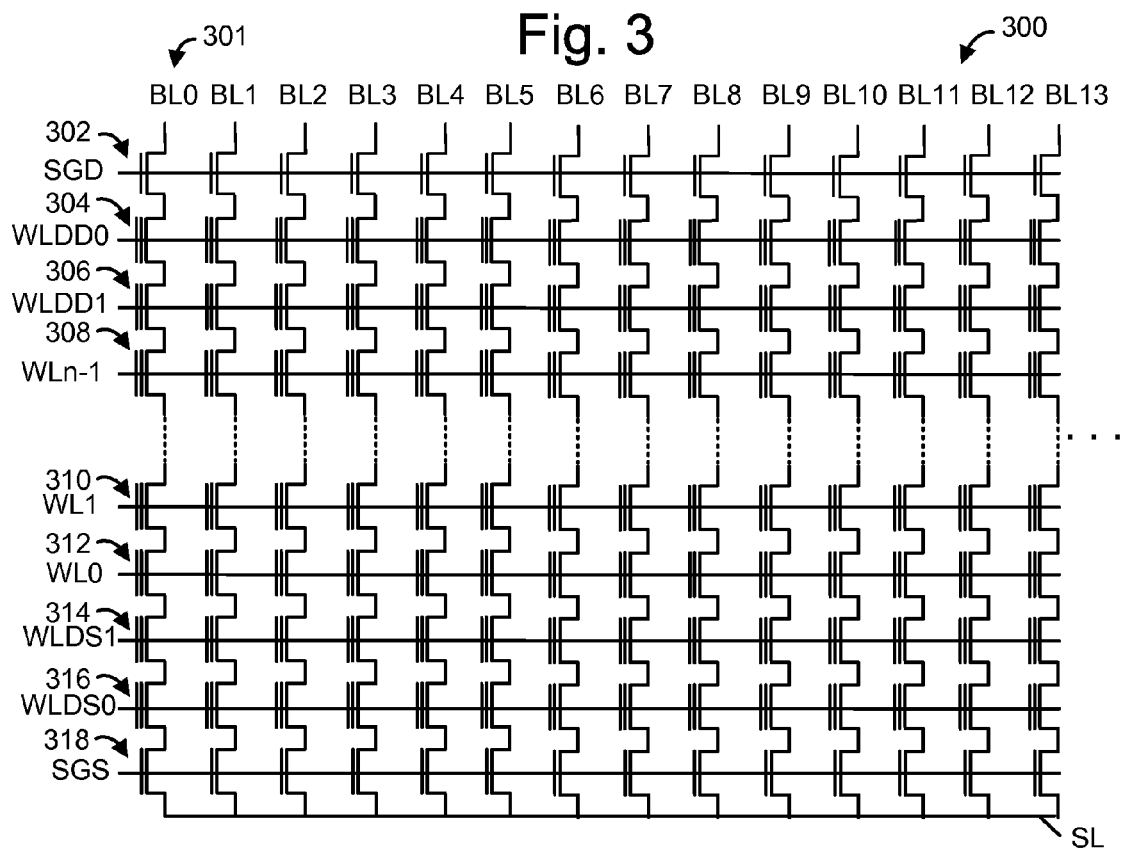

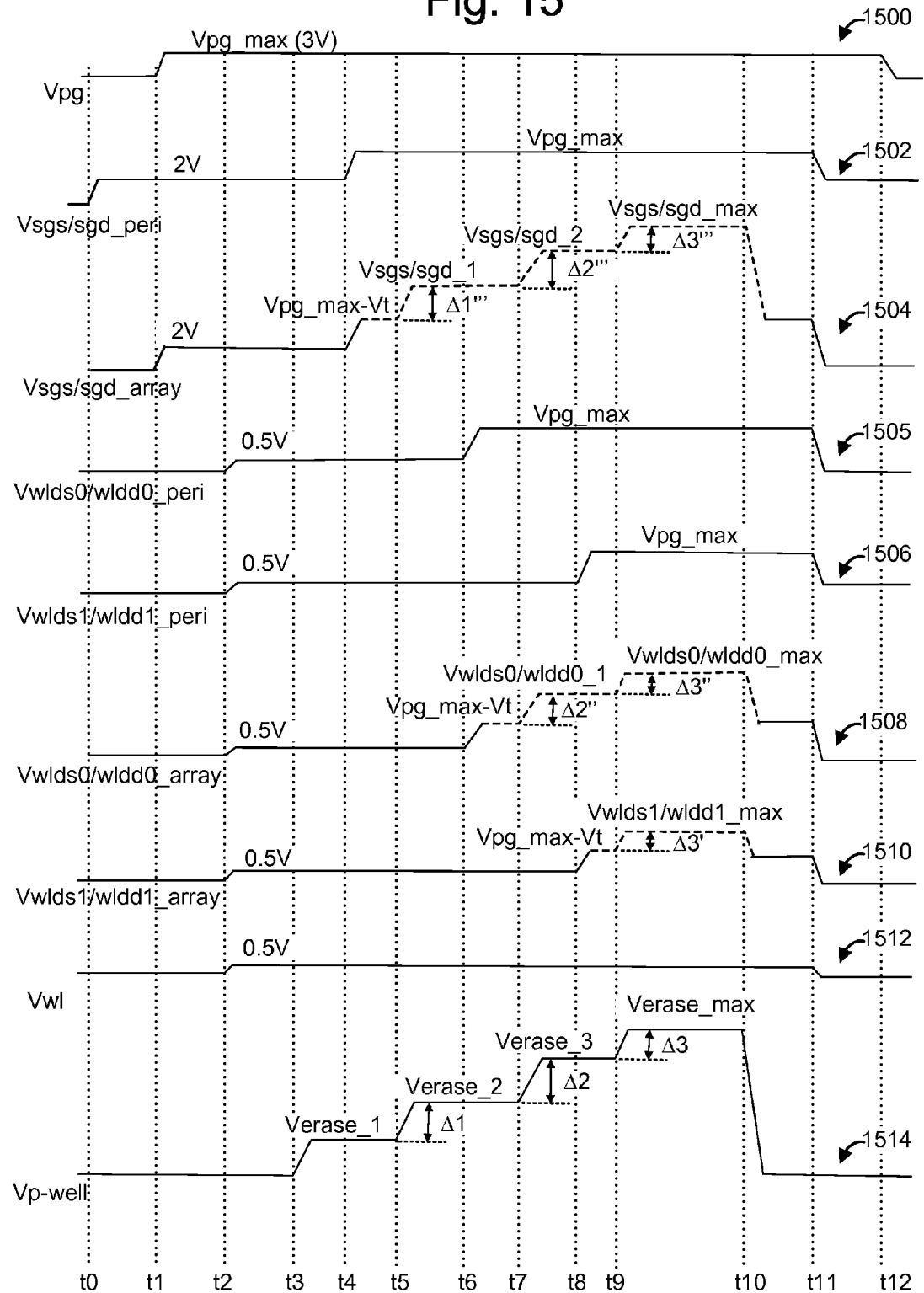

CONTROLLING DUMMY WORD LINE BIAS DURING ERASE IN NON-VOLATILE MEMORY

CLAIM OF PRIORITY

This application is a divisional application of U.S. patent application Ser. No. 13/479,649, entitled "Controlling Dummy Word Line Bias During Erase In Non-Volatile Memory," by Dutta et al., filed May 24, 2012 and published as US 2013/0314995 on Nov. 28, 2013, incorporated by reference herein in its entirety.

BACKGROUND OF THE INVENTION

1. Field of the Invention

The present invention relates to technology for non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. When erasing a flash memory device, typically an erase voltage is applied to the substrate.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device. On the other hand, a multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

However, techniques are needed for improving the endurance of non-volatile memory devices.

BRIEF DESCRIPTION OF THE DRAWINGS

FIG. 2 depicts a block of NAND flash memory cells which includes one drain-side dummy word line WLDD0 and one source-side dummy word line WLDS0.

FIG. 3 depicts a block of NAND flash memory cells which includes two drain-side dummy word lines WLDD0 and WLDD1 and two source-side dummy word lines WLDS0 and WLDS1.

FIG. 15 depicts waveforms in an example erase iteration which corresponds to the method of FIG. 10E.

DETAILED DESCRIPTION

Figure 1A:
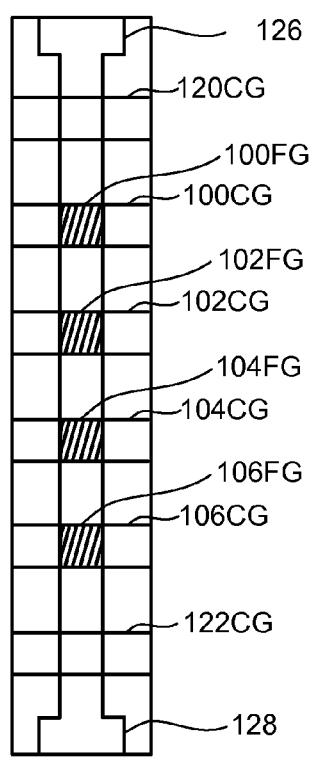
FIG. 1A is a top view of a NAND string.

Technology is described herein for providing an erase operation which improves the endurance of a non-volatile memory device such as a NAND memory device.

A NAND memory array includes an array of storage elements arranged in NAND strings on a substrate. Each NAND string has a select gate at each end, and, between the select gates, a number of storage elements which are designated for storing user data. In some cases, the NAND string also comprises one or more dummy storage elements, which are not intended to store user data. During an erase operation of the array, a large erase voltage is applied to the substrate. To avoid a large and damaging voltage across the oxide underneath select gates, the control gate voltage of the select gate is typically provided at a high level which is comparable to the magnitude of the erase voltage. The control gate voltage of the select gate can be driven at the high level or capacitively coupled up to the high level from an increase in the erase voltage of the substrate. In either case, this results in a strong electric field between the select gate and the adjacent storage element, which can trap electrons in the space between the select gates and the adjacent storage elements. These electrons interfere with the ability to perform a sense operation for the NAND string so that the write/erase endurance of the memory device is reduced.

Various erase operations described herein address this problem by reducing the electric field and the occurrence of electron trapping. In one approach, a dummy storage element is provided at each end of a NAND string, and a voltage of the dummy storage element is floated to an optimum level for maintaining the write/erase endurance. The optimum voltage level on the floating dummy storage element can be achieved by capacitive coupling from the erase voltage of the substrate. A dummy storage element can be similar to other storage elements in a NAND string but is not intended to be used to store user data. A dummy storage element is a non-user data storage element. Other, user data storage elements, which are intended to be used to store user data are between the dummy storage elements. A word line in communication with dummy storage elements is a dummy (non-user data) word line, and a word line in communication with user data storage elements is a user data word line.

The voltages of the select gates can also be floated to a higher level than the dummy storage elements. As before, the optimum voltage level on the floating select gates can be achieved by capacitive coupling from the erase voltage of the substrate, for instance. Optionally, two dummy storage elements (outer and inner) are provided at each end of a NAND string, and a voltage of the outer dummy storage element is floated to an optimum level for maintaining the write/erase endurance. The inner dummy storage elements can be driven at a level which is below the level of the outer dummy storage elements. Optionally, the inner dummy storage elements can be floated to a desired level as well. The user data storage elements can be driven at a low level, close to or at 0 V, for instance.

"Outer" and "inner" indicate the relative positions of the dummy storage elements on either end of a NAND string with respect to the user data storage elements. The outer and inner dummy storage elements on either end of a NAND string are first and second non-user data storage elements, respectively.

Compared to an approach in which the outer dummy storage elements are driven at a low level, this approach reduces the electric field between the select gate and adjacent dummy storage element, and the occurrence of electron trapping in the space between them. Moreover, a relatively high voltage can be achieved for the outer dummy storage elements without requiring associated high voltage circuitry. As a result, space on the memory chip is saved. Further, since the relatively high voltage is achieved by floating rather than by driving, power consumption in the memory chip is reduced. Note that in order to erase a storage element, the control gate of the storage elements is biased at a low bias (e.g., 0.5V) while the substrate is raised high to Verase. Thus, when the control gate of the dummy storage element is floated and capacitively coupled up to a high level, the dummy storage element is not able to erase as much as a user data storage element. However, unlike the user data storage elements, the dummy storage elements do not store any user data that needs to be erased during the erase operation. Thus, it is acceptable for the dummy storage element to not erase as much as a user data storage element.

The erase voltage of the substrate can be controlled to provide a precise amount of coupling to different targets, e.g., the select gates, the outer dummy storage elements and the inner dummy storage elements. The erase voltage can be in the form of, e.g., an increasing staircase waveform and/or a continuous ramp.

In one implementation of an erase operation, the voltage of the select gate transistor is floated, while the voltages of the dummy storage elements are driven, such as described below in FIG. 11. In another implementation of an erase operation, the voltages of the select gate transistor and the outer dummy storage element are floated, while the voltage of the inner dummy storage element is driven, such as described below in FIGS. 12-14. In another implementation of an erase operation, the voltages of the select gate transistor and the outer and inner dummy storage elements are floated, such as described below in FIG. 15.

Figure 1B:
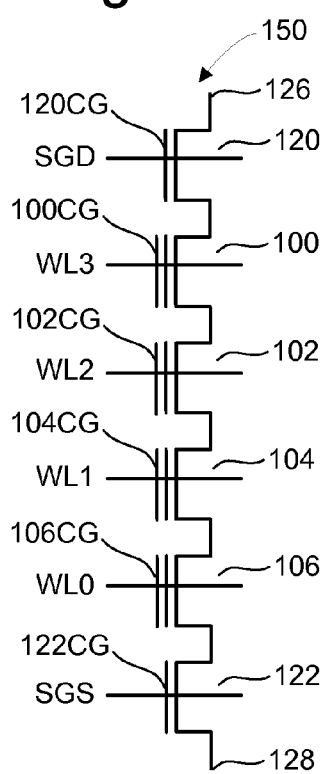
FIG. 1B is an equivalent circuit diagram of the NAND string.

One example of a memory system suitable for implementing the present invention uses the NAND flash memory structure, which arranges multiple transistors in series between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 1C:
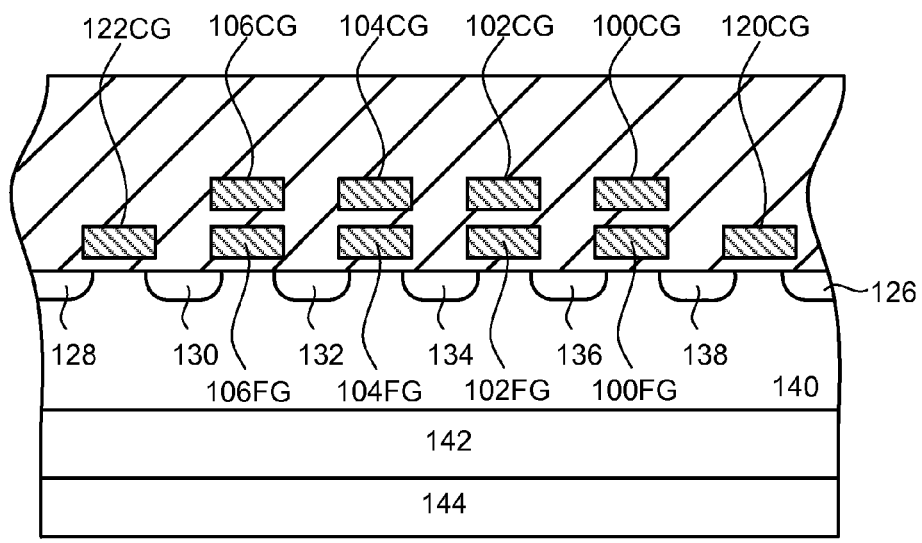
FIG. 1C is a cross-sectional view of the NAND string.

FIG. 1C provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1A-1C show four memory cells in the NAND string, the use of four transistors is provided only as an example. A NAND string used with the technology described herein can have less than four memory cells or more than four memory cells. For example, some NAND strings will include 8, 16, 32 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0V to the control gate, the memory cell will turn on to indicate logic one is being stored. When the threshold voltage is positive and a read operation is attempted by applying 0V to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used with the present invention.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

FIG. 2 depicts a block of NAND flash memory cells which includes one drain-side dummy word line WLDD0 and one source-side dummy word line WLDS0. The block 200 includes a number of NAND strings and respective bit lines, e.g., BL0, BL1, . . . . The block 200 comprises a set of non-volatile storage elements. Each NAND string is connected at one end to a select gate, drain (SGD) transistor, and the control gates of the SGD transistors are connected via a common SGD line. The NAND strings are connected at their other end to a select gate, source (SGS) transistor which, in turn, is connected to a common source line (SL). A number of word lines, including dummy word lines, extend between the source select gates and the drain select gates. For example, there are n user data word lines between a source-side dummy word line WLDS0 and a drain-side dummy word line WLDD0, for a total of n+2 word lines. Dummy word lines are in communication with associated dummy storage elements which do not store user data. WLDS0 is adjacent to the select gate, source line SGS, and WLDD0 is adjacent to the drain select gate line SGD. Dummy word lines help isolate the end word lines which are associated with storage elements which do store user data (e.g., non-dummy or user data word lines) from high voltages which are applied to the select gates.

An example NAND string 201 includes user data storage elements 206, 208, 210 and 212, an SGS transistor 216, a source-side dummy storage element 214, a SGD transistor 202 and a drain-side dummy storage element 204. The SGS transistor 216 or SGD transistor 202 are first and/or second select gate transistors. The NAND string 201 comprises a string of series-connected non-volatile storage elements between first and second select gates (202 and 216), where the series-connected non-volatile storage elements comprise a first dummy non-volatile storage element (206 or 214) adjacent to the first select gate transistor (202 or 216).

FIG. 3 depicts a block of NAND flash memory cells which includes two drain-side dummy word lines WLDD0 and WLDD1 and two source-side dummy word lines WLDS0 and WLDS1. As before, the block 300 includes a number of NAND strings and respective bit lines, e.g., BL0, BL1, . . . . The block 300 comprises a set of non-volatile storage elements. Here, there are n user data word lines between inner and outer source-side dummy word lines WLDS1 and WLDS0, respectively, and inner and outer drain-side dummy word lines WLDD1 and WLDD0, for a total of n+2 word lines (n can be different than in FIG. 2 to maintain the same number of word lines in the block). WLDS0 (and storage element 316) is adjacent to the SGS line (and SGS transistor 318), and WLDD0 (and storage element 304) is adjacent to the SGD line (and SGD transistor 302). Further, WLDS1 (and storage element 314) is adjacent to WLDS0 (and storage element 316), and WLDD1 (and storage element 306) is adjacent to WLDD0 (and storage element 304).

The SGS transistor 318 or SGD transistor 302 are first and/or second select gate transistors, respectively.

An example NAND string 301 includes user data storage elements 308, 310 and 312. The NAND string includes, at one end, an SGS transistor 318, a source-side outer dummy storage element 316 and a source-side inner dummy storage element 314. The NAND string includes, at the other end, a SGD transistor 302, a drain-side outer dummy storage element 304 and a drain-side inner dummy storage element 306. NAND string 301 comprises a string of series-connected non-volatile storage elements between first and second select gates (302 and 318), where the series-connected non-volatile storage elements comprise a first dummy non-volatile storage element (304 or 316) adjacent to the first select gate transistor (302 or 318).

Figure 4:
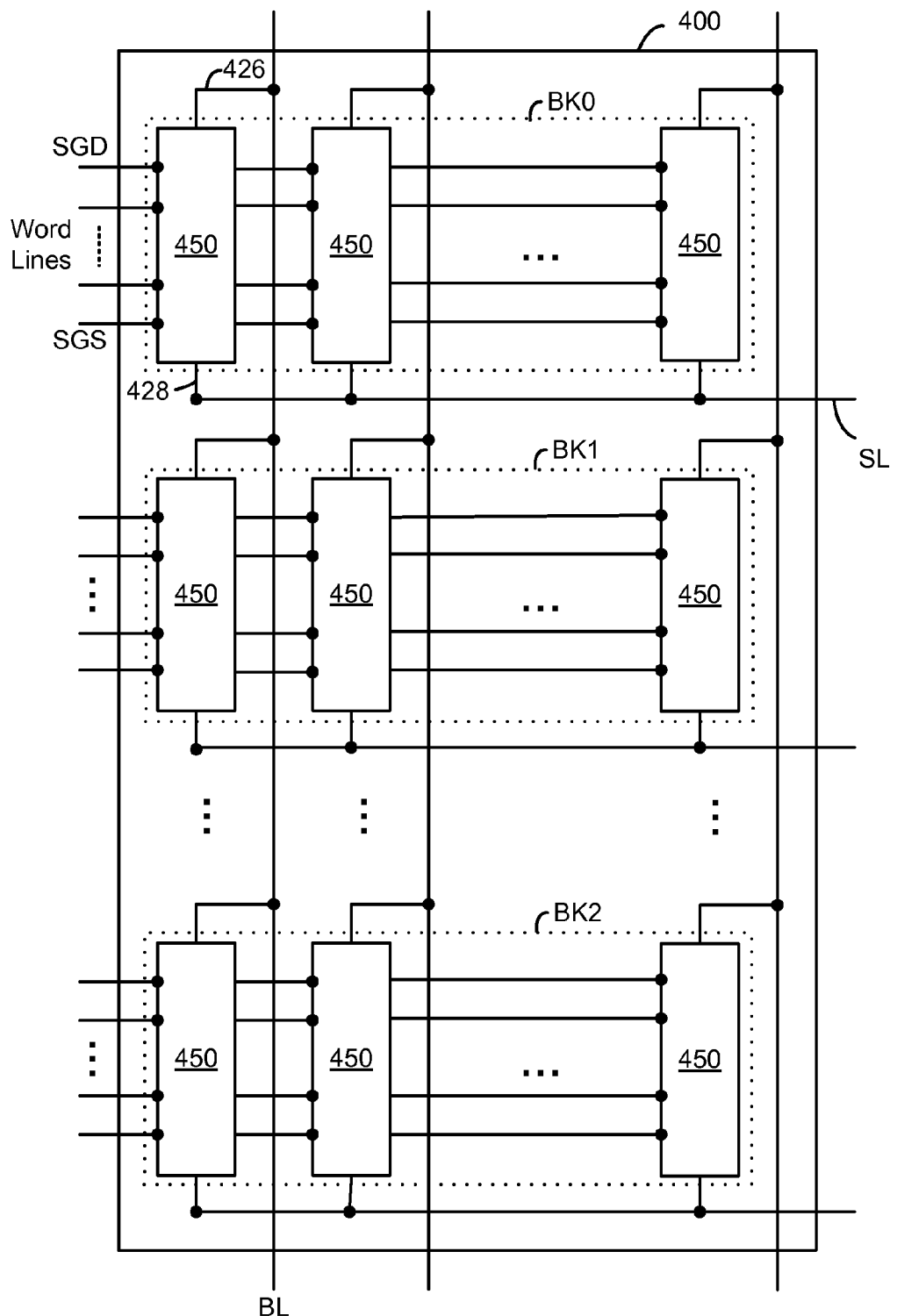
FIG. 4 is a block diagram of an array of NAND flash memory cells.

FIG. 4 illustrates an example of an array 400 of NAND cells, such as those shown in FIGS. 1A-1C. Along each column, a bit line (BL) is coupled to the drain terminal 426 of the drain select gate for the NAND string 450. Along each row of NAND strings, a source line (SL) may connect all the source terminals 428 of the source select gates of the NAND strings.

The array of storage elements is divided into a large number of blocks (e.g., BK0-BK2) of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 20 V) for a sufficient period of time and grounding or applying a low bias, e.g., 1 V, on the word lines of a selected block while the source and bit lines are floating. For example, we may apply ~1V on WLDD0 and WLDS0 during erase, while all other word lines are at 0V. Due to capacitive coupling, the unselected word lines, bit lines, select lines, and common source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells.

Figure 5:
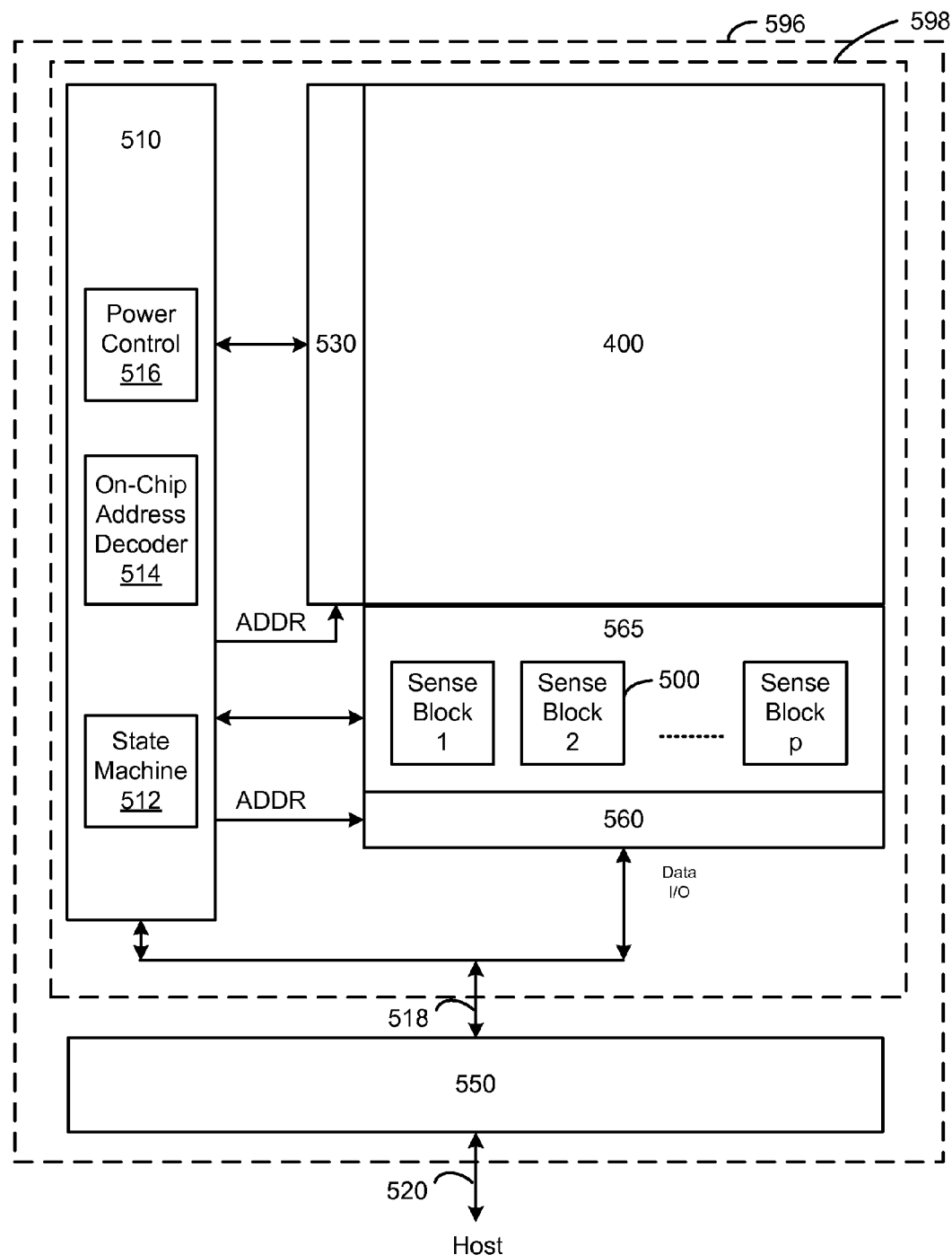
FIG. 5 is a block diagram of a non-volatile memory system.

FIG. 5 illustrates a memory device 596 having read/write circuits for reading and programming a page of memory cells in parallel, according to one embodiment of the present invention. Memory device 596 may include one or more memory die 598. Memory die 598 includes a two-dimensional array of memory cells 400, control circuitry 510, and read/write circuits 565. The memory array 400 is addressable by word lines via a row decoder 530 and by bit lines via a column decoder 560. The read/write circuits 565 include multiple sense blocks 500 and allow a page of memory cells to be read or programmed in parallel. Typically a controller 550 is included in the same memory device 596 (e.g., a removable storage card) as the one or more memory die 598. Commands and Data are transferred between the host and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514 and a power control module 516. The state machine 512 provides chip-level control of memory operations. The on-chip address decoder 514 provides an address interface between that used by the host or a memory controller to the hardware address used by the decoders 530 and 560. The power control module 516, discussed further below in connection with FIG. 9, controls the power and voltages supplied to the word lines and bit lines during memory operations. In another approach, dual row/column decoders and read/write circuits are used. A control circuit can be considered to comprise one or more of the components 510, 512, 514, 516, 530, 550, 560, 565, for instance.

Figure 6A:
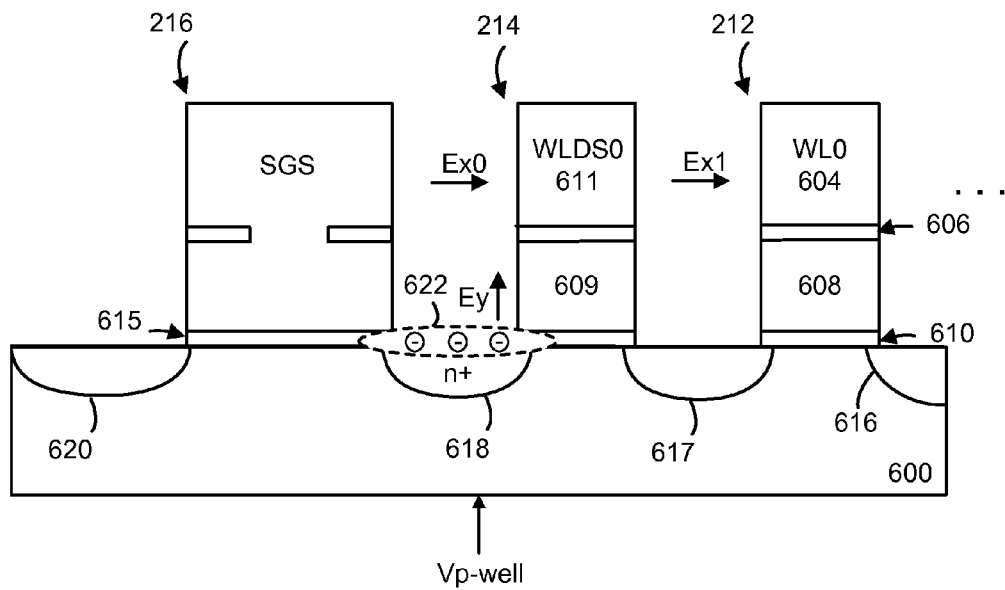
FIG. 6A is a cross section of a portion of the NAND string 201 of FIG. 2 which includes one source-side dummy storage element, showing electromagnetic fields in an erase operation and a resulting accumulation of electrons.

FIG. 6A is a cross section of a portion of the NAND string 201 of FIG. 2 which includes one source-side dummy storage element, showing electromagnetic fields in an erase operation and a resulting accumulation of electrons. The source end of the NAND string is depicted, including a user data storage element 212 which is associated with WL0, a dummy storage element 214 which is associated with WLDS0, and a source select gate (SGS) transistor 216 which is associated with a respective control line. The components are formed on a substrate 600. The example user data storage element 212 includes a gate oxide 610, floating gate 608, an interlayer dielectric 606 and a control gate 604 which is a portion of a word line WL0 which extends across multiple user data storage elements. The dummy storage element 214 includes a gate oxide, floating gate 609, an interlayer dielectric and a control gate 611 which is a portion of a word line WLDS0 which extends across multiple dummy storage elements.

The select gate transistor 216 includes a gate oxide 615. Active regions in the substrate include source/drain regions 616-618, and a region 620 at a source side of the SGS transistor 216. These regions are typically doped so that they can conduct a current.

During an erase operation, the p-well/substrate voltage is increased from a low level such as 0V to relatively high positive voltage such as 20V or more. This increase cause an electromagnetic field which is capacitively coupled from the substrate to the select gate transistors and the storage elements, raising their potentials according to a coupling ratio; provided that the potential of the select gate transistor and the storage element is allowed to float. However, if the potential of the select gate transistor or storage element is driven (not allowed to float), its potential will remain fixed at the level to which it is driven. Moreover, the associated coupling ratio for the capacitive coupling, will be relatively higher for a select gate transistor than a storage element, because: (a) the select gate transistor is larger, e.g., wider along the NAND string direction, and (b) unlike the select gate, the storage elements have a floating gate which dampens the coupling from substrate to the control gate. The increase in potential for the select gate or the storage element due to capacitive coupling is a function of the increase in the voltage of the substrate and is generally independent of the rate of increase of the voltage or whether the voltage is increased in steps or in a gradual ramp.

An example coupling ratio of the select gate transistor is rsg=0.8 (80%) so that its potential is increased by Verase*0.8 (from an initial level which can be zero or non-zero) when the substrate voltage is increased by Verase, while the select gate is floated. An example coupling ratio of the dummy storage element 214 is rwld=0.5 (50%) so that its potential is increased by Verase*0.5 when the substrate voltage is increased by Verase, while the dummy storage element is floated. The control gate of a user data storage element is typically driven during an erase operation so that, when Verase is applied, a large voltage is applied across the oxide underneath the floating gate, which draws charge out of the floating gate.

The electromagnetic field in the vertical direction, which is caused by the increase in the substrate voltage, is represented by a vertical electric field Ey. Moreover, as a result of the potential difference between the select gate transistor 216 and the dummy storage element 214, a horizontal electric field (Ex0) is generated which extends from the select gate transistor 216 to the dummy storage element 214. Further, as a result of the smaller potential difference between the dummy storage element 214 and the user data storage element 212, a smaller horizontal electric field (Ex1<Ex0) is generated which extends from the dummy storage element 214 to the user data storage element 212.

During erase, the presence of the electric fields (Ex0 and Ey) can cause electrons to be emitted from the etch back/floating gate corner (acting as a cathode) of the dummy storage element 214 to a region 622 between the edge word line/storage element 214 and the select gate transistor 216, where they accumulate. A high voltage on the select gate helps the electrons carry over to the region 622. During W/E cycling, with each erase operation, more and more electrons accumulate in the region, causing the channel underneath to deplete. A parasitic cell is thus formed by the trapped charge, leading to a worse sub-threshold slope for the select gate-dummy storage element pair and also lowers the NAND string current. The same effect occurs on the drain side, where electrons can accumulate between the edge word line/storage element 204 on the drain side and the drain select gate (SGD) transistor 202. As a result, the edge storage elements make the associated block, harder to pass erase-verify, so that additional erase voltage pulses need to be applied to the substrate to complete an erase operation, thereby reducing the W/E endurance of the block.

Figure 6B:
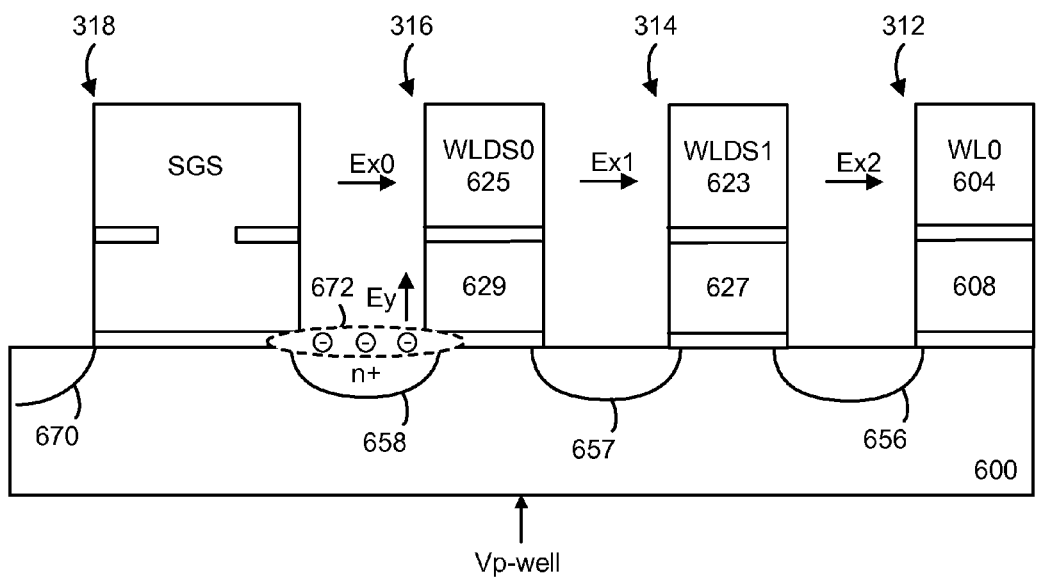
FIG. 6B is a cross section of a portion of the NAND string 301 of FIG. 3 which includes two source-side dummy storage elements, showing electromagnetic fields in an erase operation and a resulting accumulation of electrons in a region 672 between a select gate 318 and an outer dummy storage element 316.

FIG. 6B is a cross section of a portion of the NAND string 301 of FIG. 3 which includes two source-side dummy storage elements, showing electromagnetic fields in an erase operation and a resulting accumulation of electrons. The source end of the NAND string is depicted, including a user data storage element 312 which is associated with WL0, an inner dummy storage element 314 which is associated with WLDS1, an outer dummy storage element 316 which is associated with WLDS0, and a SGS transistor 318 which is associated with a respective control line. Active regions include source/drain regions 656-658 and a region 670 at a source side of the SGS transistor 318. User data storage element 312 has a control gate 604 and a floating gate 608. Inner dummy storage element 314 has a control gate 623 and a floating gate 627. Outer dummy storage element 316 has a control gate 625 and a floating gate 629.

As before, an example coupling ratio of the select gate transistor may be rsg=0.8, and an example coupling ratio of the dummy storage elements may be rwld=0.5. A horizontal field Ex0 is created when there is a voltage drop from the SGS transistor to the outer dummy storage element, a horizontal field Ex1 is created when there is a voltage drop from the outer dummy storage element to the inner dummy storage element, and a horizontal field Ex2 is created when there is a voltage drop from the inner dummy storage element to the user data storage element, where Ex0>Ex1>Ex2.

The accumulation of electrons in the region 672 can be reduced by using two dummy storage elements. In this case, the voltage drop between the select gate 318 and the user data storage element 312 can be spread across two dummy storage elements 314 and 316 instead of one. The erase operation can be arranged so that a smaller voltage difference and Ex0 field exists between the select gate 318 and the dummy storage element 316 in FIG. 6B than between the select gate 216 and the dummy storage element 214 in FIG. 6A. As a result, the accumulation of electrons in the region 672 can be less than the accumulation of electrons in the region 622. The voltages can be set at optimal levels as described below in connection with FIG. 7.

Figure 6C:
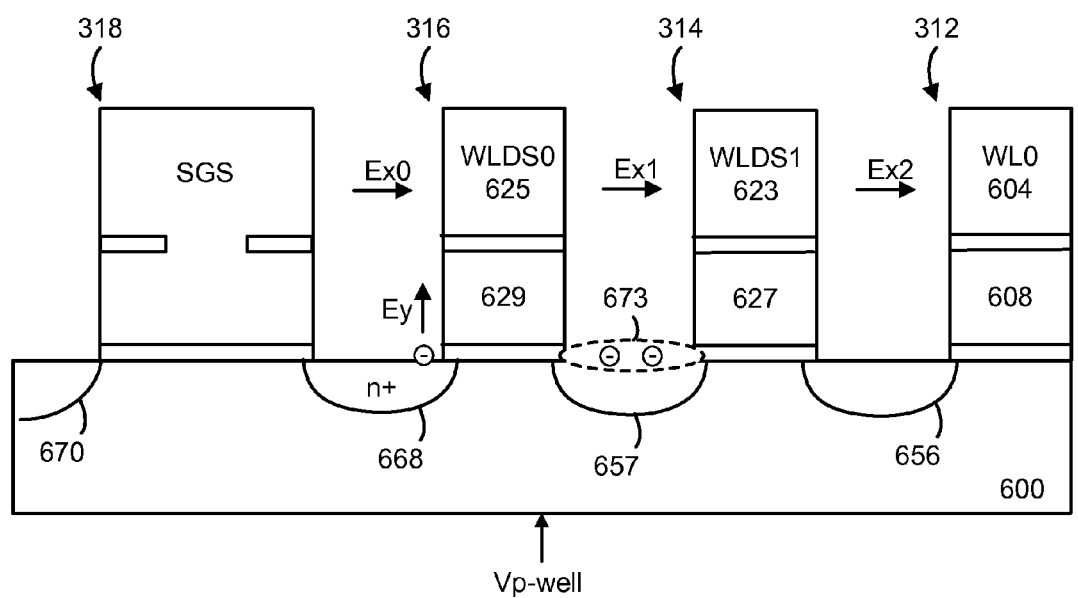
FIG. 6C is a cross section of a portion of the NAND string 301 of FIG. 3, showing electromagnetic fields in an erase operation and a resulting accumulation of electrons in a region 673 between an outer dummy storage element 316 and an inner dummy storage element 314.

However, if the voltages of the select gate and the dummy storage elements are not controlled appropriately, the problem of charge trapping in a region between the select gate and the outer dummy storage element can be passed on to a region 673 between the outer dummy storage element 316 and the inner dummy storage element 314 as depicted in FIG. 6C. FIG. 6C is a cross section of a portion of the NAND string 301 of FIG. 3, showing electromagnetic fields in an erase operation and a resulting accumulation of electrons in a region 673 between an outer dummy storage element 316 and an inner dummy storage element 314.

Figure 7:
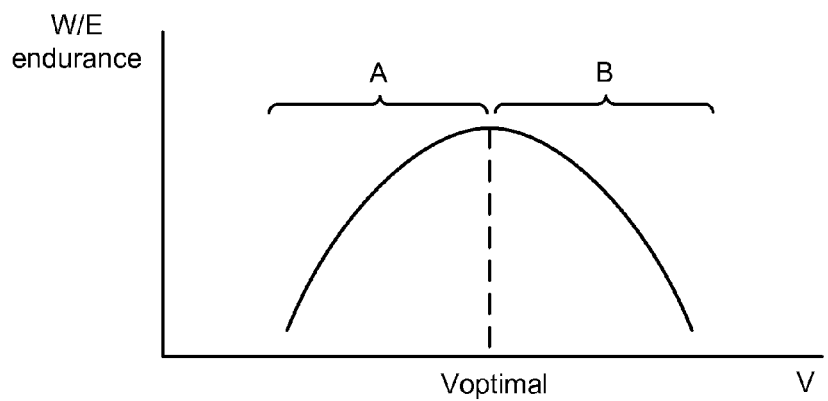
FIG. 7 depicts a write-erase endurance optimization curve of a dummy storage element showing a region "A" in which an electric field between a select gate and an outer (first) dummy storage element, is too high, and a region "B" in which an electric field between the outer dummy storage element and an inner (second) dummy storage element is too high.

FIG. 7 depicts a write-erase endurance optimization curve of a dummy storage element showing a region "A" in which an electric field between a select gate and an outer (first) dummy storage element, is too high, and a region "B" in which an electric field between the outer dummy storage element and an inner (second) dummy storage element is too high.

One optimization involves setting the peak level of the voltage of the select gate transistor (Vsgd or Vsgs). Controlling this voltage to a lower value during an erase operation can help improve endurance since a higher voltage makes the degradation worse. However, a lower voltage can cause reliability issues by placing excessive stress on the gate oxide 615. In practice, the optimal peak voltage of the select gate can be determined for a particular memory device from experimentation and/or theoretical calculations.

Another optimization involves the peak levels of the voltages of the one or more dummy storage elements, for either end of a NAND string. To reduce Ex0, the electric field between the select gate and the outer dummy storage element, the voltage of the outer dummy storage element (Vwlds0 and Vwldd0) can be increased. However, a higher Vwlds0 and Vwldd0 increases Ex1, the electric field between the outer dummy storage element and the inner dummy storage element. If Ex1 is too high, it will cause the charge trapping and degradation problem between the outer and inner dummy storage elements as depicted in FIG. 6C.

Referring to the source side of the NAND string, with the voltage of the select gate (Vsgs) and the voltage of the inner dummy storage element (Vwlds1) at specified levels, the voltage of the outer dummy storage element (Vwlds0) can be optimized at a level Voptimal, so that Vsgs-Vwlds0 and Ex0 are not too high, on one hand, and Vwlds0-Vwlds1 and Ex1 are not too high, on the other hand. Referring to the drain side of the NAND string, the voltage of the outer dummy storage element (Vwldd0) can be optimized at a level Voptimal (which can be different than for Vwlds0), so that Vsgd-Vwldd0 is not too high, on one hand, and Vwldd0-Vwldd1 is not too high, on the other hand. Ex2 is generally sufficiently low so that charge trapping and degradation between the inner dummy storage element and the edge user data storage element is not a problem.

Note that, in the case of two dummy word lines at the end of a NAND string, Vwlds1 and Vwldd1 (FIG. 6B) may be the same as Vwlds and Vwldd (FIG. 6A), respectively, so that the user data storage elements are not affected.

Figure 8A:
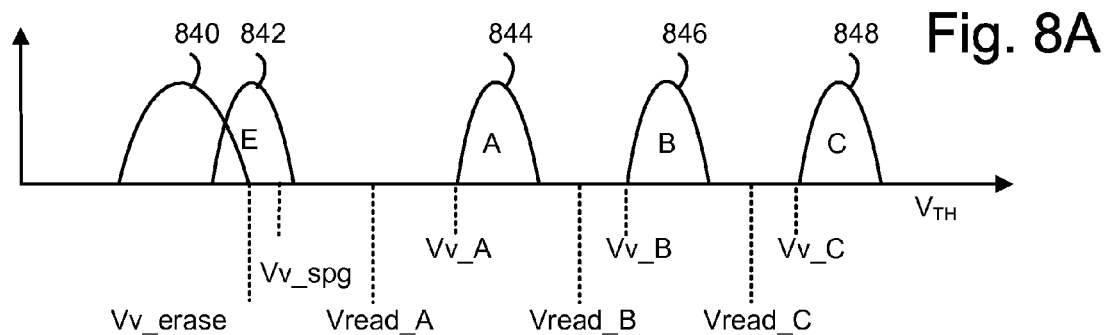
FIG. 8A depicts example threshold voltage distributions of an erased state and higher data states for a set of non-volatile storage elements.

FIG. 8A depicts example threshold voltage distributions of an erased state and higher data states for a set of non-volatile storage elements. The x-axis indicates a threshold voltage and the y-axis indicates a number of storage elements. In this example, there are four data states: an erased (E) state 842, an A state 844, a B state 846 and a C state 848. Memory devices with additional data states, e.g., eight or sixteen data states, or fewer states, e.g., two states, can also be used. An erase sequence can include an erase operation and an optional soft programming operation. The distribution 840 is realized after the erase operation when storage elements are typically over-erased, past the erase state 842. An erase operation can include successive erase-verify iteration (see FIG. 8B). Each erase-verify iteration includes an erase iteration comprising an erase pulse followed by a verify iteration comprising a verify pulse and sensing operation. Erase pulses are applied to the substrate until the threshold voltage of the storage elements being erased transitions below an erase verify level, Vv_erase.

Once the erase operation is completed, the soft programming operation can be performed, in which a number of positive voltage pulses are applied to the control gates of the storage elements, such as via a word line, to increase the threshold voltages of some or all of the storage elements in the distribution 840 closer to and below a soft programming verify level, Vv_spgm, to the erased state 842. Vv_spgm is typically above or equal to Vv_erase. The soft programming operation advantageously results in a narrow erase state distribution 802. Once the soft programming operation is complete, programming to higher data states can occur, such as to states A, B and C using verify levels Vv_A, Vv_B and Vv_C, respectively. A subsequent read operation can use the levels Vread_A, Vread_B and Vread_C.

Figure 8B:
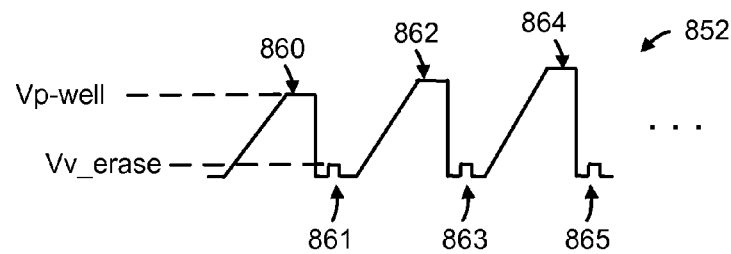
FIG. 8B depicts a sequence of erase-verify iterations of an erase operation.

FIG. 8B depicts a sequence of erase-verify iterations of an erase operation. An erase operation may involve applying a series of erase pulses/waveforms to the p-well of a memory device. Here, an erase operation 852 includes example erase pulses 860, 862 and 864 (representing respective erase iterations of the erase operation), and erase verify pulses 861, 863 and 865 (representing respective verify iterations of the erase operation). In another possible erase operation, a single erase pulse is applied. The peak level of the erase pulses can increase in each erase-verify iteration, in one approach. In the implementations discussed below (FIGS. 11-15), the erase pulse or waveform is more complicated and may have one or more steps and/or ramps which are designed to provide one or more controlled sources of capacitive coupling.

Figure 9:
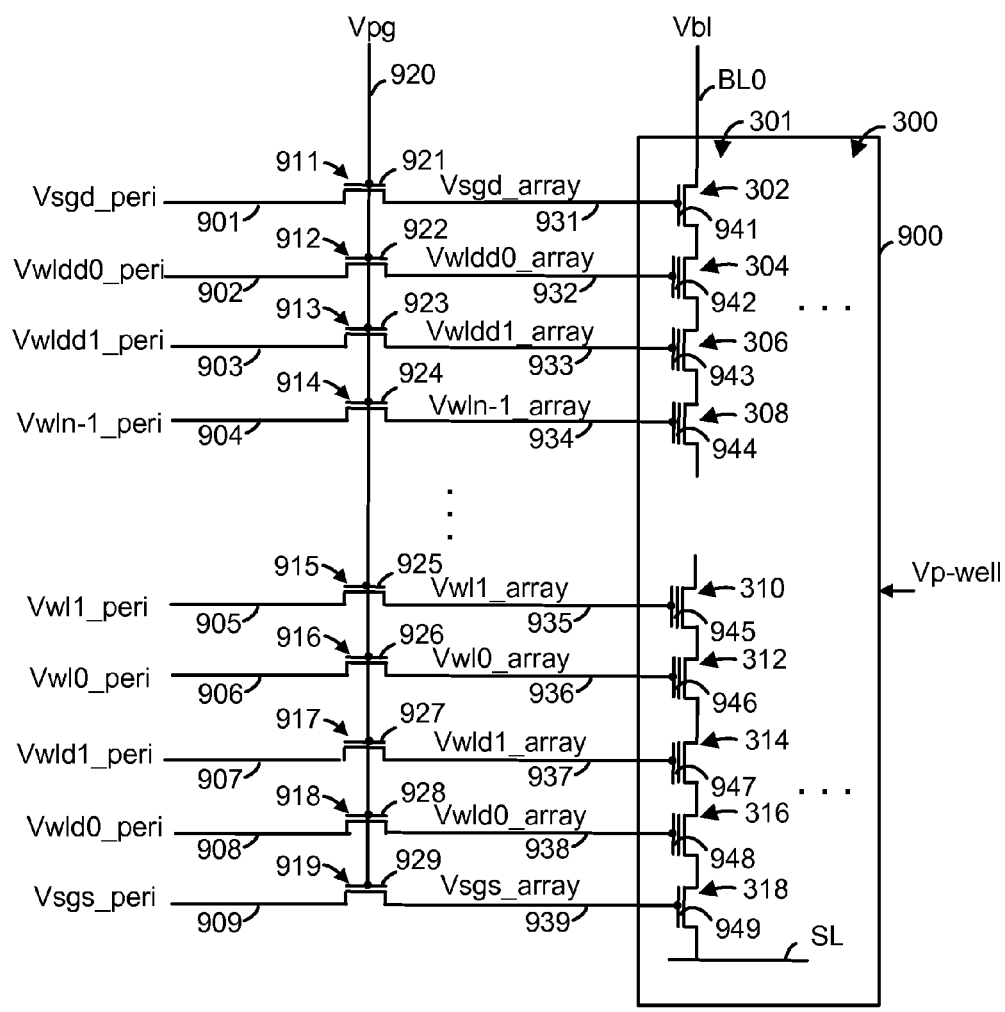
FIG. 9 depicts a circuit which can be part of the power control module 516 of FIG. 5, for instance, showing pass gate transistors which are used to drive or float voltages on respective control lines, and the NAND string 301 of FIG. 3B.

FIG. 9 depicts a circuit which can be part of the power control module 516 of FIG. 5, for instance, showing pass gate transistors which are used to drive or float voltages on respective control lines, and the NAND string 301 of FIG. 3B. A control line can be, e.g., a word line which is in communication with the control gates of storage elements arranged along the word line, or a select gate transistor line which is in communication with the control gates of select gate transistors (SGS or SGD) arranged along the select gate transistor line.

The NAND string 301 in the block 300 is depicted as an example. Other NAND strings in the block are not depicted. Word lines WLDD0, WLDD1, WLn-1, . . . , WL1, WL0, WLD1 and WLD0 are connected to control gates 942, 943, 944, . . . , 945, 946, 947 and 948, respectively, of storage elements 304, 306, 308, . . . , 310, 312, 314 and 316, respectively. SGD line 931 is connected to a control gate 941 of the SGD transistor 302. SGS line 939 is connected to a control gate 949 of the SGS transistor 318. A voltage can be driven on each control line via a respective pass gate (pg) transistor which is controlled by a common control gate voltage Vpg from a block decoder (not shown) of the block, in one possible implementation. Vpg is provided to the control gate of each pass gate transistor via a common line 920. The common line is connected to control gates 921-929 of pass gate transistors 911-919, respectively. Each pass gate transistor has a source terminal connected to a voltage driver via a peripheral (peri)-side line, and a drain terminal connected to a select gate transistor or storage element via an array-side line. Specifically, peripheral-side lines 901-909 and array-side lines 931-939 are connected to pass gate transistors 911-919, respectively. The driven voltages on the peripheral-side lines 901-909 are Vsgd_peri, Vwldd0_peri, Vwldd1_peri, Vwln-1_peri, . . . Vwl1_peri, Vwl0_peri, Vwld1_peri, Vwld0_peri and Vsgs_peri, respectively. The p-well erase voltage Vp-well is applied to the substrate 900 on which the block 300 is formed.

The peripheral-side lines are typically each driven at a zero- or non-zero level during an erase operation. For any control line, if Vpg is sufficiently high (e.g., greater than the peripheral-side voltage+Vt, the threshold voltage of the pass gate transistor) the pass gate transistor will be in a conductive state and pass the peripheral-side voltage to the array-side control line. On the other hand, If Vpg is not sufficiently high (e.g., it is equal to or less than the peripheral-side voltage+Vt) the pass gate transistor will be in a non-conductive state so that a voltage is floated on the array-side control line and the associated control gate. A floating control line and control gate is subject to capacitive coupling such as from the substrate when an erase pulse is increased. Typically, if a select gate or a storage element is to be floated while the gates or storage elements in the block are to be driven, the peripheral-side voltage for the control line associated with that select gate or storage element is raised up to a high enough level, such that its associated pass gate transistor becomes non-conductive, while for the rest of the control lines, the peripheral-side voltage is biased low enough to maintain their respective pass gates in a conductive state. Also, note that, while a select gate or a storage element is being driven; for its associated control line, the peripheral-side voltage is same as the array-side voltage. On the other hand, in a floating condition, the array-side voltage is not equal (it is generally higher) to the peripheral-side voltage. The control lines can be set as discussed in further detail below.

Figure 10A:
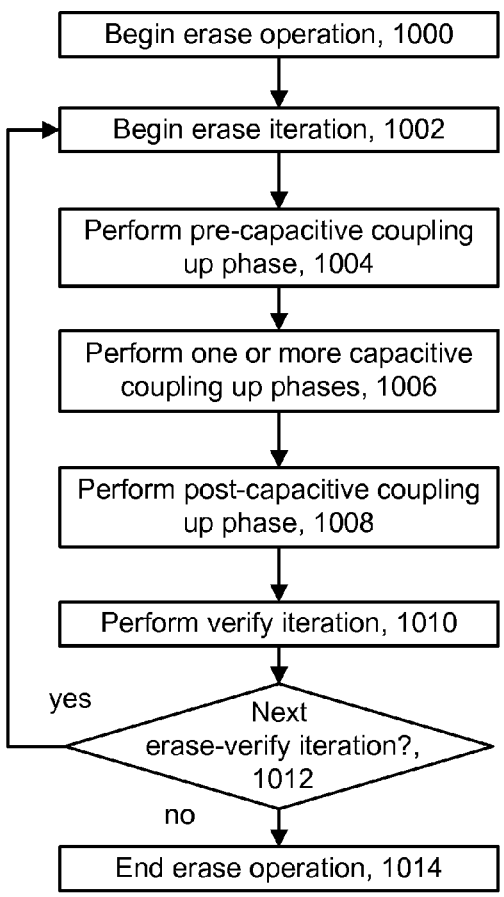
FIG. 10A depicts an overview of an erase operation which uses capacitive coupling to increase the control gate voltages of dummy storage elements.

FIG. 10A depicts an overview of an erase operation which uses capacitive coupling to increase the control gate voltages of dummy storage elements. The steps include: Begin erase operation, 1000; Begin erase iteration, 1002; Perform pre-capacitive coupling up phase, 1004; Perform one or more capacitive coupling up phases, 1006; Perform post-capacitive coupling up phase, 1008; Perform verify iteration, 1010; Next erase-verify iteration?, 1012; and End erase operation, 1014. If decision step 1012 is true, it is followed by step 1002. If decision step 1012 is false, it is followed by step 1014. The pre-capacitive coupling up phase involves driving the control line voltages at specified levels so that the capacitive coupling which occurs in the capacitive coupling up phase raises the voltage starting from the specified level. This phase can involve an increase in Vp-well to a specified level and/or for a specified time. The array-side control lines are generally driven (not floated) in the pre-capacitive coupling up phase. Selected ones of the array-side control lines are floated for at least part of the capacitive coupling up phase. One or more capacitive coupling up phases can be used successively to provide separate controlled increments or sources of coupling.

Figure 10B:
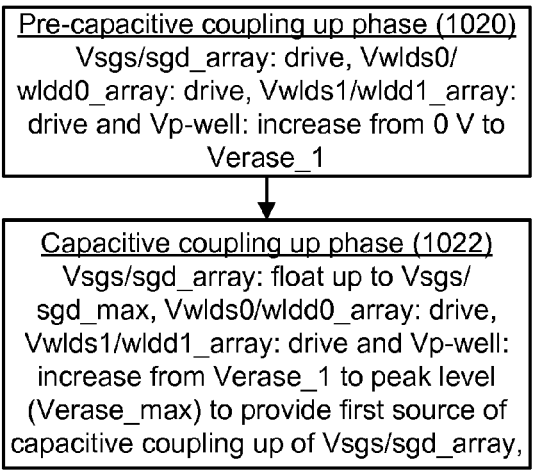
FIG. 10B depicts an embodiment of the pre-capacitive coupling up phase 1004 and the capacitive coupling up phase 1006 of FIG. 10A, where the select gate voltages are increased by capacitive coupling in one capacitive coupling up phase due to a step increase in Vp-well, and the control gate voltages of dummy storage elements are driven.

FIG. 10B depicts an embodiment of the pre-capacitive coupling up phase 1004 and the capacitive coupling up phase 1006 of FIG. 10A, where the select gate voltages are increased by capacitive coupling in one capacitive coupling up phase due to a step increase in Vp-well, and the control gate voltages of dummy storage elements are driven. In step 1020, the pre-capacitive coupling up phase, the voltages are set as follows: Vsgs/sgd_array: drive, Vwlds0/wldd0_array: drive, Vwlds1/wldd1_array: drive and Vp-well: increase from 0V to Verase_1 (both are driven levels). In step 1022, the capacitive coupling up phase, the voltages are set as follows: Vsgs/sgd_array: float up to Vsgs/sgd_max, Vwlds0/wldd0_array: drive, Vwlds1/wldd1_array: drive and Vp-well: increase from Verase_1 to peak level (Verase_max) to provide first source of capacitive coupling up to Vsgs/sgd_array. See FIG. 11 for an example implementation.

Figure 10C:
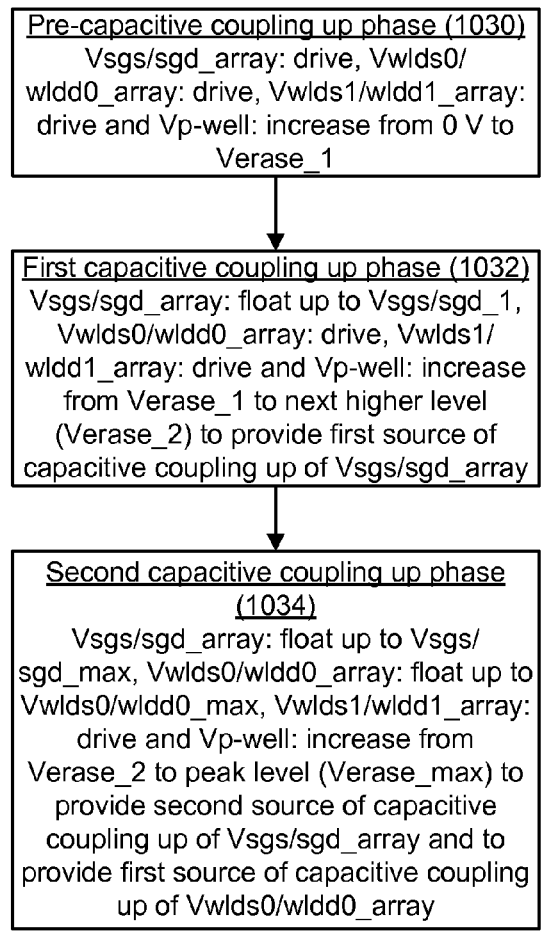
FIG. 10C depicts an embodiment of the pre-capacitive coupling up phase 1004 and the capacitive coupling up phase 1006 of FIG. 10A, where the select gate voltages and the control gate voltages of the first (outer) dummy storage elements are increased by capacitive coupling due to step increases in Vp-well in two capacitive coupling up phases, and the control gate voltages of the second (inner) dummy storage elements are driven.

FIG. 10C depicts an embodiment of the pre-capacitive coupling up phase 1004 and the capacitive coupling up phase 1006 of FIG. 10A, where the select gate voltages and the control gate voltages of the first (outer) dummy storage elements are increased by capacitive coupling due to step increases in Vp-well in two capacitive coupling up phases, and the control gate voltages of the second (inner) dummy storage elements are driven. In step 1030, the pre-capacitive coupling up phase, the voltages are set as follows: Vsgs/sgd_array: drive, Vwlds0/wldd0_array: drive, Vwlds1/wldd1_array: drive and Vp-well: increase from 0V to Verase_1. In step 1032, the first capacitive coupling up phase, the voltages are set as follows: Vsgs/sgd_array: float up to Vsgs/sgd_1, Vwlds0/wldd0_array: drive, Vwlds1/wldd1_array: drive and Vp-well: increase from Verase_1 to next higher level (Verase_2) to provide first source of capacitive coupling up to Vsgs/sgd_array. In step 1034, the second capacitive coupling up phase, the voltages are set as follows: Vsgs/sgd_array: float up to Vsgs/sgd_max, Vwlds0/wldd0_array: float up to Vwlds0/wldd0_max, Vwlds1/wldd1_array: drive and Vp-well: increase from Verase_2 to peak level (Verase_max) to provide second source of capacitive coupling up to Vsgs/sgd_array and to provide first source of capacitive coupling up to Vwlds0/wldd0_array. See FIG. 12 for an example implementation.

Figure 10D:
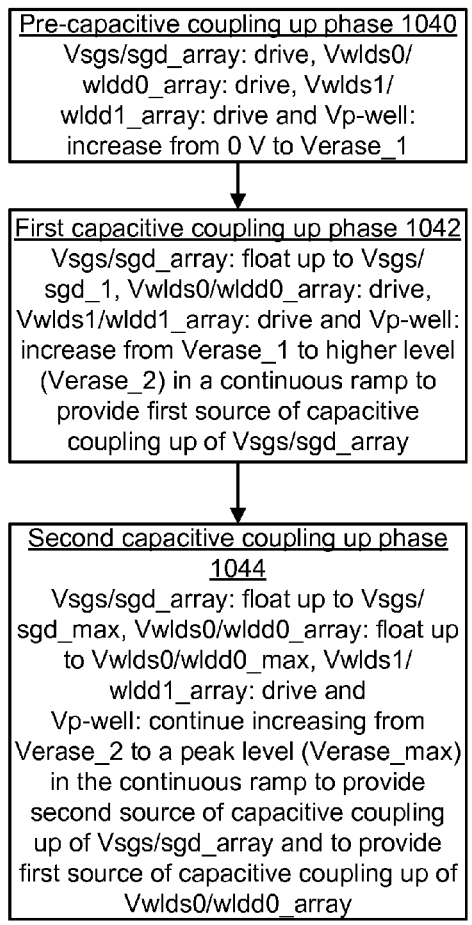
FIG. 10D depicts an embodiment of the pre-capacitive coupling up phase 1004 and the capacitive coupling up phase 1006 of FIG. 10A, where the select gate voltages and the control gate voltages of the first (outer) dummy storage elements are increased by capacitive coupling due to a continuous ramp increase in Vp-well in two capacitive coupling up phases, and the control gate voltages of the second (inner) dummy storage elements are driven, where the select gate voltages are floated at a start of the continuous ramp or after a delay from the start of the continuous ramp, and the control gate voltages of the first (outer) dummy storage elements are floated after a delay from the start of the continuous ramp.

FIG. 10D depicts an embodiment of the pre-capacitive coupling up phase 1004 and the capacitive coupling up phase 1006 of FIG. 10A, where the select gate voltages and the control gate voltages of the first (outer) dummy storage elements are increased by capacitive coupling due to a continuous ramp increase in Vp-well in two capacitive coupling up phases, and the control gate voltages of the second (inner) dummy storage elements are driven, where the select gate voltages are floated at a start of the continuous ramp or after a delay from the start of the continuous ramp, and the control gate voltages of the first (outer) dummy storage elements are floated after a delay from the start of the continuous ramp.

In step 1040, the pre-capacitive coupling up phase, the voltages are set as follows: Vsgs/sgd_array: drive, Vwlds0/wldd0_array: drive, Vwlds1/wldd1_array: drive and Vp-well: increase from 0V to Verase_1. In step 1042, the first capacitive coupling up phase, the voltages are set as follows: Vsgs/sgd_array: float up to Vsgs/sgd_1, Vwlds0/wldd0_array: drive, Vwlds1/wldd1_array: drive and Vp-well: increase from Verase_1 to higher level (Verase_2) in a continuous ramp to provide first source of capacitive coupling up to Vsgs/sgd_array. In step 1044, the second capacitive coupling up phase, the voltages are set as follows: Vsgs/sgd_array: float up to Vsgs/sgd_max, Vwlds0/wldd0_array: float up to Vwlds0/wldd0_max, Vwlds1/wldd1_array: drive and Vp-well: continue increasing from Verase_2 to a peak level (Verase_max) in the continuous ramp to provide second source of capacitive coupling up to Vsgs/sgd_array and to provide first source of capacitive coupling up to Vwlds0/wldd0_array. See FIG. 13 or 14 for further details.

Figure 10E:
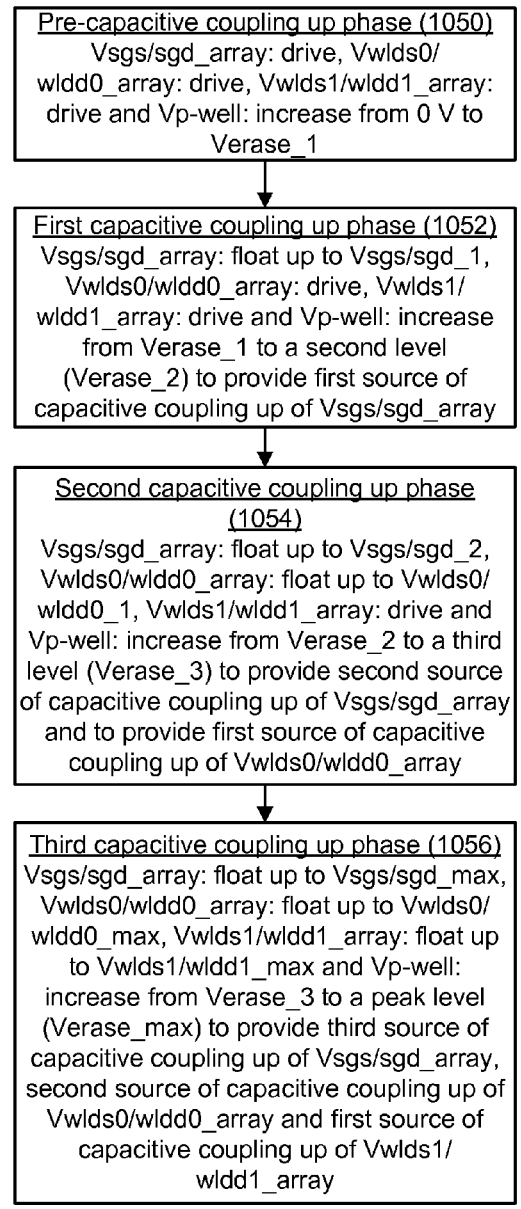
FIG. 10E depicts an embodiment of the pre-capacitive coupling up phase 1004 and the capacitive coupling up 1006 phase of FIG. 10A, where the select gate voltages, the control gate voltages of the first (outer) dummy storage elements and the control gate voltages of the second (inner) dummy storage elements are increased by capacitive coupling due to step increases in Vp-well in three capacitive coupling up phases.

FIG. 10E depicts an embodiment of the pre-capacitive coupling up phase 1004 and the capacitive coupling up phase 1006 of FIG. 10A, where the select gate voltages, the control gate voltages of the first (outer) dummy storage elements and the control gate voltages of the second (inner) dummy storage elements are increased by capacitive coupling due to step increases in Vp-well in three capacitive coupling up phases. In step 1050, the pre-capacitive coupling up phase, the voltages are set as follows: Vsgs/sgd_array: drive, Vwlds0/wldd0_array: drive, Vwlds1/wldd1_array: drive and Vp-well: increase from 0V to Verase_1. In step 1052, the first capacitive coupling up phase, the voltages are set as follows: Vsgs/sgd_array: float up to Vsgs/sgd_1, Vwlds0/wldd0_array: drive, Vwlds1/wldd1_array: drive and Vp-well: increase from Verase_1 to a second level (Verase_2) to provide first source of capacitive coupling up to Vsgs/sgd_array. In step 1054, the second capacitive coupling up phase, the voltages are set as follows: Vsgs/sgd_array: float up to Vsgs/sgd_2, Vwlds0/wldd0_array: float up to Vwlds0/wldd0_1, Vwlds1/wldd1_array: drive and Vp-well: increase from Verase_2 to a third level (Verase_3) to provide second source of capacitive coupling up to Vsgs/sgd_array and to provide first source of capacitive coupling up to Vwlds0/wldd0_array. In step 1056, the third capacitive coupling up phase, the voltages are set as follows: Vsgs/sgd_array: float up to Vsgs/sgd_max, Vwlds0/wldd0_array: float up to Vwlds0/wldd0_max, Vwlds1/wldd1_array: float up to Vwlds1/wldd1_max and Vp-well: increase from Verase_3 to a peak level (Verase_max) to provide third source of capacitive coupling up to Vsgs/sgd_array, second source of capacitive coupling up to Vwlds0/wldd0_array and first source of capacitive coupling up to Vwlds1/wldd1_array. See FIG. 15 for further details.

Figure 11:
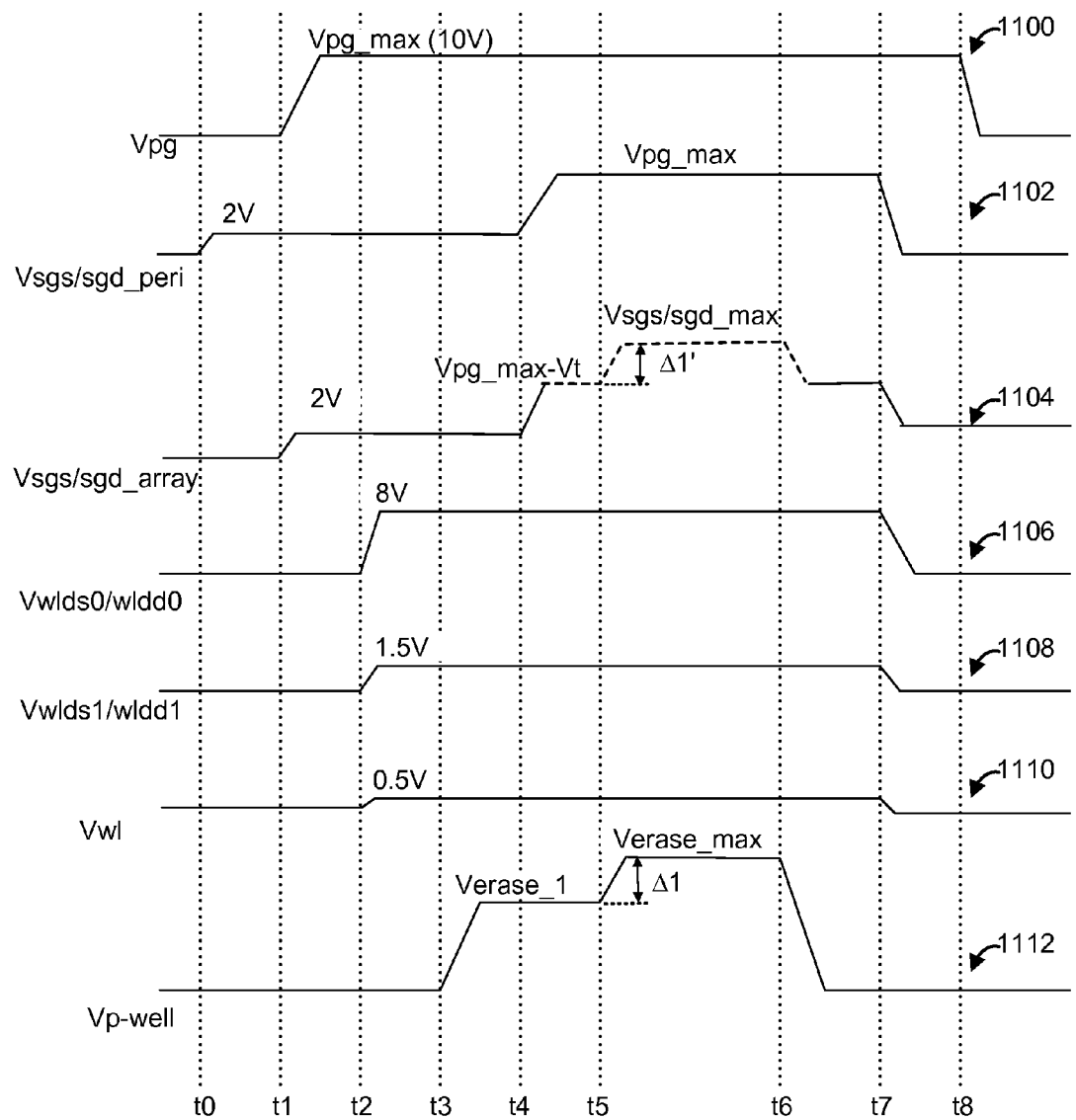
FIG. 11 depicts waveforms in an example erase iteration which corresponds to the method of FIG. 10B.

FIG. 11 depicts waveforms in an example erase iteration which corresponds to the method of FIG. 10B. In FIGS. 11-15 a dashed line waveform indicates a floating voltage and a solid line waveform indicates a driven or fixed voltage. Time points t0, t1, . . . represent increasing time. The time points are not necessarily equally spaced or to scale, and the time points in the different figures are not necessarily corresponding. The starting and ending levels of the waveforms can be 0 V, in one approach.

The correspondence between the waveforms and the voltages is as follows: 1100: Vpg; 1102: Vsgs/sgd_peri (i.e., Vsgs_peri and/or Vsgd_peri); 1104: Vsgs/sgd_array (i.e., Vsgs_array and/or Vsgd_array); 1106: Vwlds0/wldd0 (i.e., Vwlds0_peri=Vwlds0_array and/or Vwldd0_peri=Vwldd0_array); 1108: Vwlds1/wldd1 (i.e., Vwlds1_peri=Vwlds1_array and/or Vwldd1_peri=Vwldd1_array); 1110: user data word line (Vwl); and 1112: Vp-well. The pre-capacitive coupling up phase is from t0-t5, the capacitive coupling up phase is just after t5 and a post-capacitive coupling up phase follows.

As an example, assume a decision is made that the optimal value for Vwlds0/wldd0 is 8V, so these voltages are driven at 8V at t2. A result of this decision is that Vpg_max is set to, e.g., 10 V, to ensure the associated pass gate transistors are conductive, to pass the 8V. Throughout the erase iteration, the associated pass gate is made conductive by setting Vpg_max>(Vwlds0/wldd0+Vt). For example, the Vt (threshold voltage) of the pass gate transistor may be only 0.2V. 10V is 2V higher than 8V and provides a comfortable margin.

Further, assume a decision is made that a peak level to which Vsgs/sgd_array will be floated is Vsgs/sgd_max. This level can be achieved by driving Vsgs/sgd_array to a specified initial zero or non-zero level, e.g., 2V, then floating Vsgs/sgd_array while subsequently increasing Vp-well by a specified amount to provide a specified amount of coupling up to Vsgs/sgd_array. Assuming Verase_max is at a specified level, Vp-well can be driven to a level Verase_1 at t3, then stepped up to Verase_max at t5. This step up of magnitude $\Delta 1$=Verase_max-Verase_1 is a first source of capacitive coupling up to the control gates of the select gate transistors.

Vsgd/sgd_array is made to float just after t4 by raising Vsgd/sgd_peri=Vpg_max so that the associated pass gate becomes non-conductive. In one approach, the step up is the fastest available rate at which the voltage driving circuitry can increase the voltage (e.g., Vp-well).

Vsgd/sgd_array=Vpg_max-Vt just after t4. Vsgd/sgd_array is coupled up by $\Delta 1'=\Delta 1*rsg$ at t5 as Vp-well is increased. Thus, Vsgs/sgd_max=Vpg_max-Vt+$\Delta 1'$. $\Delta 1$ and hence $\Delta 1'$ and Vsgs/sgd_max can be adjusted by adjusting Verase_1, for a given Verase_max. For example, Vsgs/sgd_max will be higher when Verase_1 is lower. The erase pulse is applied at its peak level Verase_max from t5-t6 and lowered at t6. Vwlds1/wldd1 can be driven at a low level such as 1.5V and the Vwl (user data WL) can be driven at a relatively low level such as 0.5V. This level can be zero or non-zero.

For the discharge sequence, at t6, Vp-well discharges from Vera_max to 0V. Once Vp-well discharges, any floating element (e.g., Vsgs/sgd_array) couples down with the Vp-well until it reaches Vpg_max-Vt (the level at which it was before the coupling up phase). At this point, its associated pass gate will become conductive, and thus the storage element is essentially no more floating (it is driven). From that point on, its array and peri-side control lines will be at the same level (e.g., Vsgs/sgd_peri=Vsgs/sgd_array). Thus, when Vsgs/sgd_peri drops at t7, Vsgs/sgd_array follows and drops with it.

Recall that Verase_max is a peak level within a given erase iteration of an erase operation. Verase_max can increase step-wise in successive erase iterations such as depicted in FIG. 8B.

An advantage of this approach is that the process is highly controllable since Vwlds0/wldd0 is driven throughout the erase iteration. A disadvantage is that power is used to drive Vpg and Vwlds0/wldd0 at a relatively high level such as 8-10V. Also, there is a size penalty in the memory die since the associated pass gates must be sized to support the relatively high bias.

Figure 12:
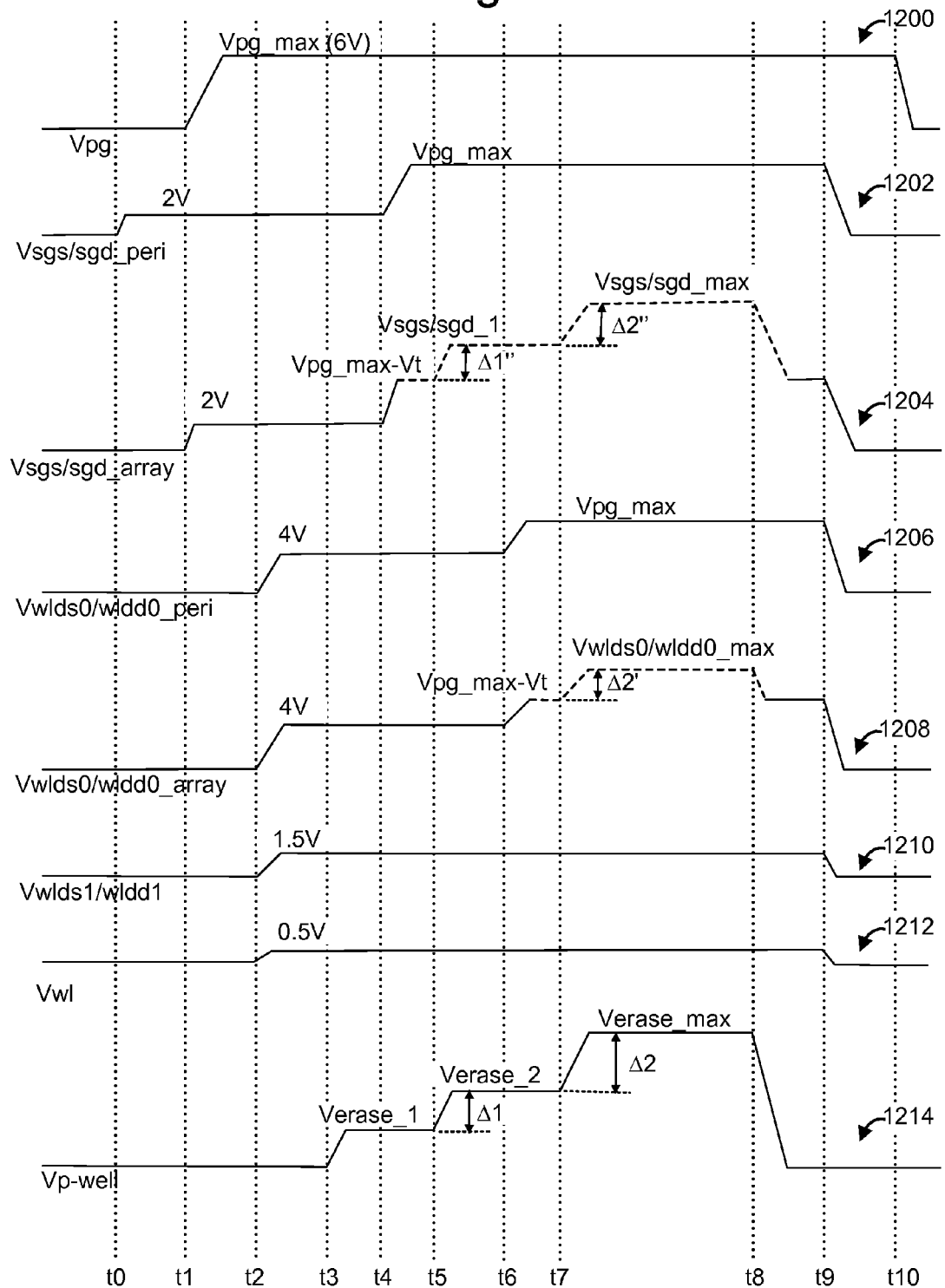
FIG. 12 depicts waveforms in an example erase iteration which corresponds to the method of FIG. 10C.

FIG. 12 depicts waveforms in an example erase iteration which corresponds to the method of FIG. 10C. The correspondence between the waveforms and the voltages is as follows: 1200: Vpg; 1202: Vsgs/sgd_peri; 1204: Vsgs/sgd_array; 1206: Vwlds0/wldd0_peri; 1208: Vwlds0/wldd0_array; 1210: Vwlds1/wldd1 (array or peri); 1212: Vwl; and 1214: Vp-well. The pre-capacitive coupling up phase is from t0-t5, a first capacitive coupling up phase is just after t5, a second capacitive coupling up phase is just after t7 and a post-capacitive coupling up phase follows.

An advantage of this approach is that Vwlds0/wldd0_array is floated to its peak level Vwlds0/wldd0_max instead of being driven, so less power is used and the pass gate can be driven at a lower level (e.g., 6V instead of 10V, in one approach) and sized accordingly. Vpg_max could be even lower. For example, the approach of FIG. 15 uses an even lower Vpg_max (e.g., 2V). Vpg_max need only be high enough to maintain the pass gate transistors in a conductive state to pass any driven voltages to the array-side control lines.

Vp-well has three steps in this approach. Vp-well is driven to Verase_1 at t3, then stepped up in separate increments of Δ1 and Δ2 just after t5 and t7, respectively, to provide first and second sources, respectively, of capacitive coupling. Once Vsgs/sgd_peri is raised to Vpg_max at t4, Vsgs/sgd_array begins floating just after t4 so that it is coupled up by the first and second sources of capacitive coupling. Specifically, Vsgs/sgd_array is coupled up from Vpg_max-Vt to Vsgs/sgd_1 (an increase of Δ1"=Δ1*rsg) just after t5, and from Vsgs/sgd_1 to Vsgs/sgd_max (an increase of Δ2"=Δ2*rsg) just after t7. Once Vwlds0/wldd0_peri is raised to Vpg_max at t6, Vwlds0/wldd0_array begins floating just after t6 so that it is coupled up by the second source of capacitive coupling but not the first source of capacitive coupling. Instead, Vwlds0/wldd0_array is driven at, e.g., 4 V, during the first source of capacitive coupling. Vwlds0/wldd0_array is coupled up from Vpg_max-Vt to Vwlds0/wldd0_max (an increase of Δ2'=Δ2*rwld) just after t7.

Δ1 and hence Δ1" and Vsgs/sgd_max can be adjusted by adjusting Verase_1, for a given Verase_max. For example, Vsgs/sgd_max will be higher when Verase_1 is lower. Δ2 and hence Δ2', Δ2" and Vwlds0/wldd0_max can be adjusted by adjusting Verase_2, for a given Verase_max. For example, Vwlds0/wldd0_max will be higher when Verase_2 is lower.

The increasing of the erase voltage to provide the first source of capacitive coupling (just after t5) occurs before the increasing of the erase voltage to provide the second source of capacitive coupling (just after t7).

Figure 13:
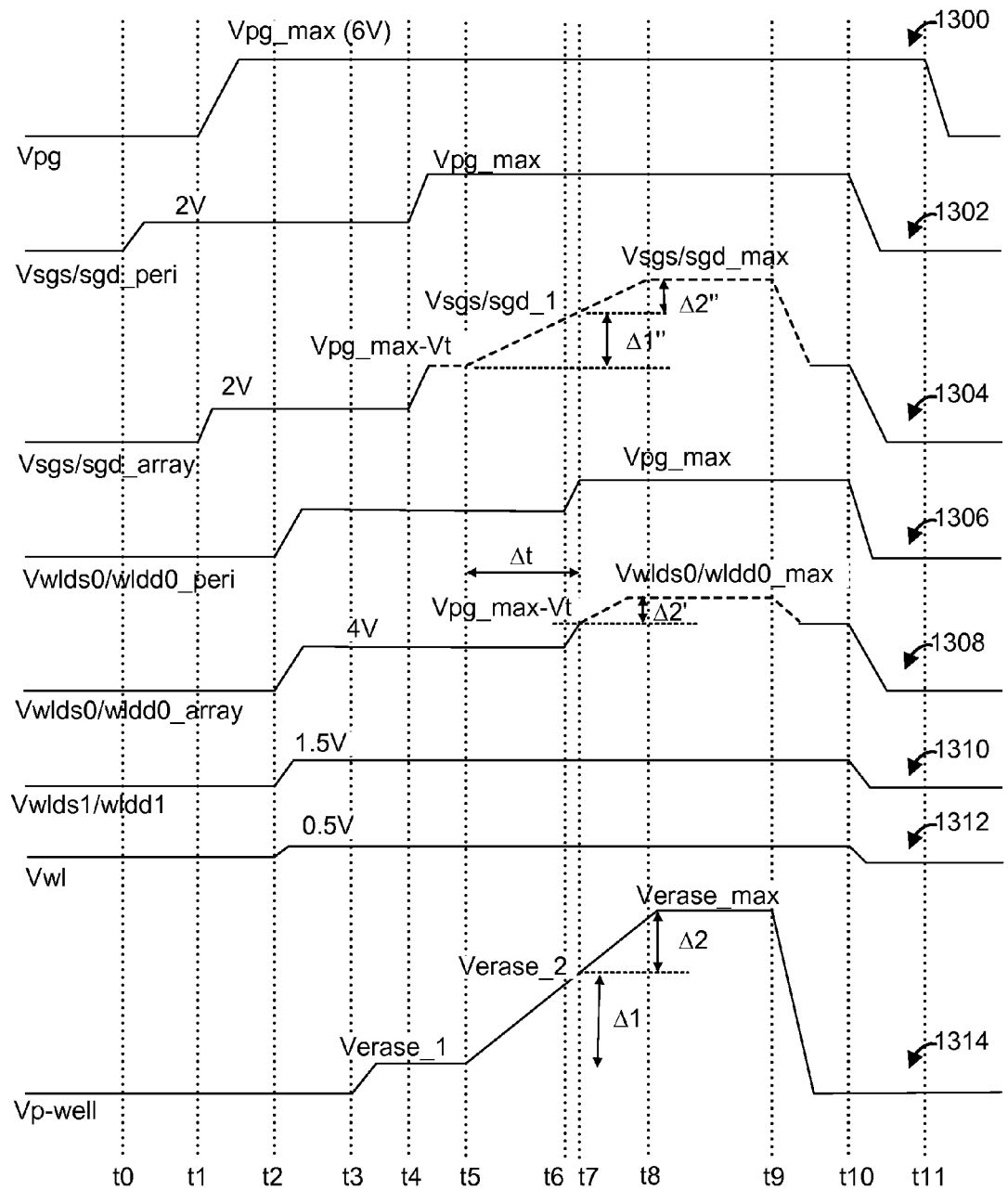
FIG. 13 depicts waveforms in an example erase iteration which corresponds to one embodiment of the method of FIG. 10D.

FIG. 13 depicts waveforms in an example erase iteration which corresponds to one embodiment of the method of FIG. 10D. As an alternative, Vp-well can be increased more gradually, in a ramp, rather than as a step. A ramp increase may be an increase which is at a rate which is less than the fastest rate available at which the voltage driving circuitry can increase the voltage (e.g., Vp-well).

The correspondence between the waveforms and the voltages is as follows: 1300: Vpg; 1302: Vsgs/sgd_peri; 1304: Vsgs/sgd_array; 1306: Vwlds0/wldd0_peri; 1308: Vwlds0/wldd0_array; 1310: Vwlds1/wldd1 (array or peri); 1312: Vw1; and 1314: Vp-well. The pre-capacitive coupling up phase is from t0-t5, a first capacitive coupling up phase is from t5-t7, a second capacitive coupling up phase is from t7 to t8 and a post-capacitive coupling up phase follows.

As before, an advantage is that Vwlds0/wldd0_array is floated to its peak level Vwlds0/wldd0_max instead of being driven, so less power is used and the pass gate can be driven at a lower level. Moreover, the amount of coupling up to Vwlds0/wldd0_array is controllable based on a time delay Δt.

Vp-well has one step and one continuous ramp in this approach. Vp-well is driven to Verase_1 at t3, then ramps up from t5-t8. A portion of the ramp from t5-t7 which increases by Δ1 provides a first source of capacitive coupling, and a portion of the ramp from t7-t8 which increases by Δ2 provides a second source of capacitive coupling. Once Vsgs/sgd_peri is raised to Vpg_max at t4, Vsgs/sgd_array begins floating just after t4 so that it is coupled up by the first and second sources of capacitive coupling. Specifically, Vsgs/sgd_array is coupled up from Vpg_max-Vt to Vsgs/sgd_1 (an increase of Δ1"=Δ1*rsg) from t5-t7, and from Vsgs/sgd_1 to Vsgs-sgd_max (an increase of Δ2"=Δ2*rsg) from t7-t8. Once Vwlds0/wldd0_peri is raised to Vpg_max between t6 and t7, Vwlds0/wldd0_array begins floating at t7 so that it is coupled up by the second source of capacitive coupling but not the first source of capacitive coupling. Instead, Vwlds0/wldd0_array is driven at, e.g., 4 V, during the first source of capacitive coupling. Specifically, Vwlds0/wldd0_array is coupled up from Vpg_max-Vt to Vwlds0/wldd0_max (an increase of Δ2'=Δ2*rwld) from t7-t8.

In this case, the time delay Δt can be defined as a time between a start of the continuous ramp of Vp-well and a time at which Vwlds0/wldd0_array begins floating, e.g., Δt=t7-t5.

Δ1 and hence Δ1" and Vsgs/sgd_max can be adjusted by adjusting Verase_1, for a given Verase_max. For example, Vsgs/sgd_max will be higher when Verase_1 is lower. Δ2 and hence Δ2', Δ2" and Vwlds0/wldd0_max can be adjusted by adjusting Δt, for a given Verase_max. For example, Vwlds0/wldd0_max will be higher when Δt is smaller (i.e., V_erase2 is lower).

The increasing of the erase voltage to provide the first source of capacitive coupling (from t5-t7, in one time period) occurs before the increasing of the erase voltage to provide the second source of capacitive coupling (from t7-t8, in another time period, non-overlapping with the one time period). The increase of the voltage (Vp-well) of the substrate is continuous throughout a time period (t5-t8) which comprises the one time period and the another time period.

The increase of Vp-well in the one time period comprises a voltage ramp, and the increase of Vp-well in the another time period comprises another voltage ramp.

Figure 14:
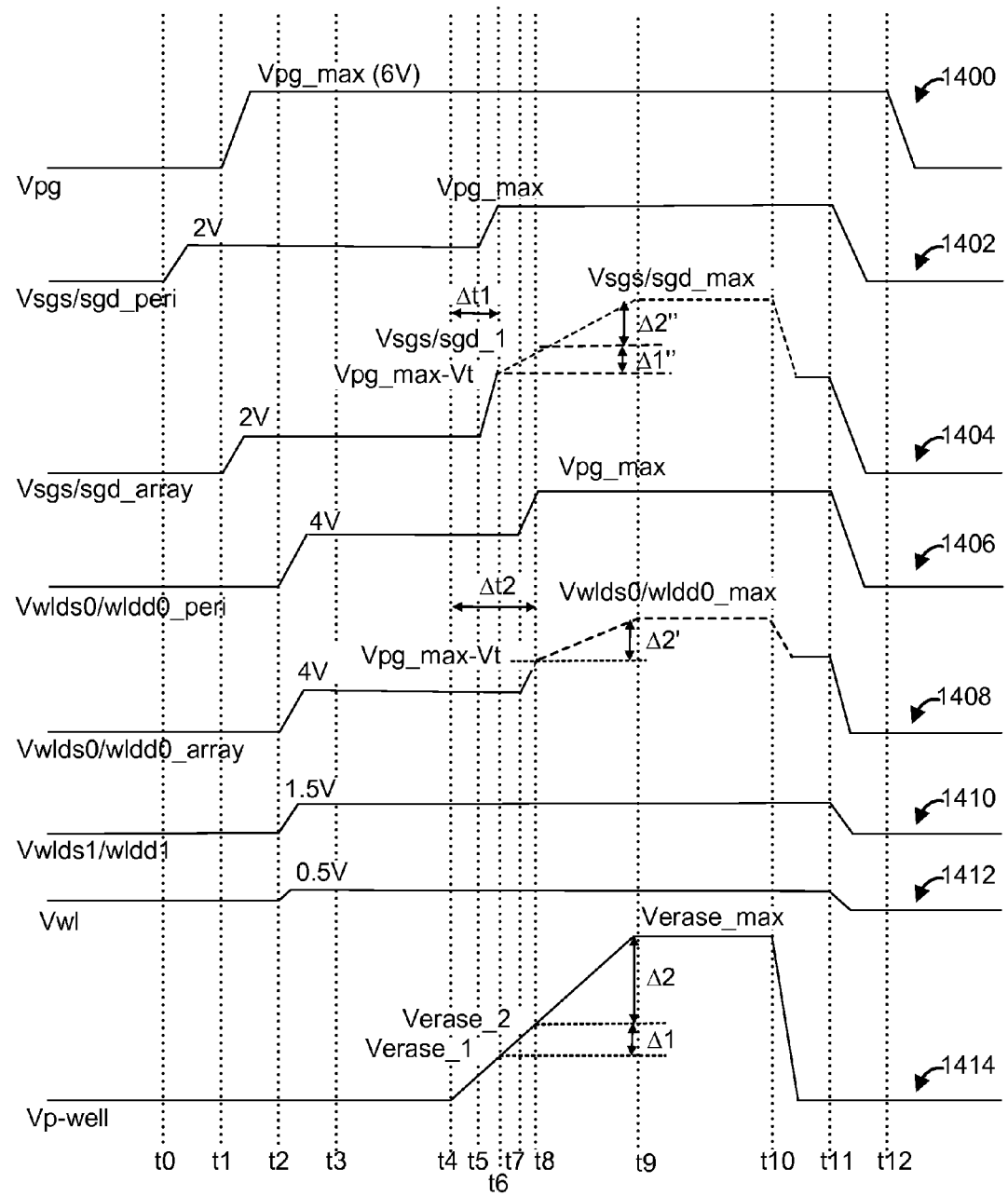
FIG. 14 depicts waveforms in an example erase iteration which corresponds to another embodiment of the method of FIG. 10D.

FIG. 14 depicts waveforms in an example erase iteration which corresponds to another embodiment of the method of FIG. 10D. This is a variation of the approach of FIG. 13. Here, one time delay Δt1 indicates the time delay between the beginning of Vp-well ramp and the time at which Vsgs/sgd_array begins floating; and another time delay Δt2>Δt1 indicates the time delay between the beginning of Vp-well ramp and the time at which Vslds0/wldd0_array begins floating. These time delays can be adjusted as desired. In some cases, it may be easier to adjust a time delay parameter than to adjust a voltage level, to achieve a desired level of coupling. The correspondence between the waveforms and the voltages is as follows: 1400: Vpg; 1402: Vsgs/sgd_peri; 1404: Vsgs/sgd_array; 1406: Vwlds0/wldd0_peri; 1408: Vwlds0/wldd0_array; 1410: Vwlds1/wldd1 (array or peri); 1412: Vw1; and 1414: Vp-well. The pre-capacitive coupling up phase is from t0-t6, a first capacitive coupling up phase is from t6-t8, a second capacitive coupling up phase is from just after t8 to t9 and a post-capacitive coupling up phase follows.

As before, an advantage is that Vwlds0/wldd0_array is floated to its peak level Vwlds0/wldd0_max instead of being driven, so less power is used and the pass gate can be driven at a lower level. Moreover, the amount of coupling up to Vwlds0/wldd0_array is controllable based on a time delay Δt2.

Vp-well has no step and one continuous ramp in this approach. Vp-well ramps up from t4-t9. A portion of the ramp from t6-t8 which increases by Δ1 provides a first source of capacitive coupling, and a portion of the ramp from t8-t9 which increases by Δ2 provides a second source of capacitive coupling.

Once Vsgs/sgd_peri is raised to Vpg_max between t5 and t6, Vsgs/sgd_array begins floating at t6 so that it is coupled up by the first and second sources of capacitive coupling. Specifically, Vsgs/sgd_array is coupled up from Vpg_max-Vt to Vsgs/sgd_1 (an increase of Δ1"=Δ1*rsg) from t6-t8, and from Vsgs/sgd_1 to Vsgs-sgd_max (an increase of Δ2"=Δ2*rsg) from t8-t9. Once Vwlds0/wldd0_peri is raised to Vpg_max between t7 and t8, Vwlds0/wldd0_array begins floating at t8 so that it is coupled up by the second source of capacitive coupling but not the first source of capacitive coupling. Instead, Vwlds0/wldd0_array is driven at, e.g., 4 V, during the first source of capacitive coupling. Specifically, Vwlds0/wldd0_array is coupled up from Vpg_max-Vt to Vwlds0/wldd0_max (an increase of $\Delta 2'=\Delta 2*rwld$) from t8-t9.

In this case, the time delay $\Delta t1$ can be defined as a time between a start of the continuous ramp of Vp-well at t4 and a time at which Vsgs/sgd_array begins floating, e.g., $\Delta t1=t6-t4$. Also, the time delay $\Delta t2$ can be defined as a time between a start of the continuous ramp of Vp-well at t4 and a time that Vwlds0/wldd0_array begins floating, e.g., $\Delta t2=t8-t4$.

$\Delta 1$ and hence $\Delta 1''$ and Vsgs/sgd_max can be adjusted by adjusting $\Delta t1$, for a given Verase_max. For example, Vsgs/sgd_max will be higher when $\Delta t1$ is less (i.e., Verase_1 is lower). $\Delta 2$ and hence $\Delta 2'$, $\Delta 2''$ and Vwlds0/wldd0_max can be adjusted by adjusting $\Delta t2$, for a given Verase_max. For example, Vwlds0/wldd0_max will be higher when $\Delta t2>\Delta t1$ is smaller (i.e., V_erase2 is lower).

The increasing of the erase voltage to provide the first source of capacitive coupling (from t6-t8) occurs before the increasing of the erase voltage to provide the second source of capacitive coupling (from t8-t9).

The increase of Vp-well is continuous throughout a time period (t6-t9) which comprises one time period (t6-t8) and another time period (t8-t9). The increase of Vp-well in the one time period comprises one voltage ramp, and the increase of Vp-well in the another time period comprises another voltage ramp.

The floating the voltage (Vsgs/sgd_array) of the control gate of the select gate transistor during the increasing the erase voltage of the substrate to provide the first source of capacitive coupling, is initiated at one specified time (t6) after initiating the continuous increasing of the erase voltage of the substrate at t4. This time delay is t6-t4. The floating the voltage Vwlds0/wldd0_array of the control gate of the first dummy non-volatile storage element during the increasing the erase voltage of the substrate to provide the second source of capacitive coupling is initiated at another specified time t8 after the initiating the continuous increasing of the erase voltage of the substrate. This time delay is t8-t4. The another specified time is after the one specified time.

FIG. 15 depicts waveforms in an example erase iteration which corresponds to the method of FIG. 10E. In previous examples, the inner dummy storage element has been driven at a relatively low level such as Vwlds1/wldd1=1.5V. Here, Vwlds1/wldd1 is coupled up to a desired level.

The correspondence between the waveforms and the voltages is as follows: 1500: Vpg; 1502: Vsgs/sgd_peri; 1504: Vsgs/sgd_array; 1505: Vwlds0/wldd0_peri; 1506: Vwlds1/wldd1_peri; 1508: Vwlds0/wldd0_array; 1510: Vwlds1/wldd1_array; 1512: user data word line (WL); and 1514: Vp-well. The pre-capacitive coupling up phase is from t0-t5, a first capacitive coupling up phase is just after t5, a second capacitive coupling up phase is just after t7, a third capacitive coupling up phase is just after t9 and a post-capacitive coupling up phase follows.

An advantage of this approach is that Vwlds1/wldd1_array is floated to its peak level Vwlds1/wldd1_max instead of being driven, so less power is used and the pass gate can be driven at a low level (e.g., 3V) and sized accordingly. A disadvantage is that additional time is needed to couple up Vwlds1/wldd1_array.

Vp-well has four steps in this approach. Vp-well is driven to Verase_1 at t3, then stepped up in separate increments of $\Delta 1$, $\Delta 2$ and $\Delta 3$ just after t5, t7 and t9, respectively, to provide first, second and third sources, respectively, of capacitive coupling. Once Vsgs/sgd_peri is raised to Vpg_max at t4, Vsgs/sgd_array begins floating just after t4 so that it is coupled up by the first, second and third sources of capacitive coupling. Specifically, Vsgs/sgd_array is coupled up from Vpg_max-Vt to Vsgs/sgd_1 (an increase of $\Delta 1'''=\Delta 1*rsg$) just after t5, from Vsgs/sgd_1 to Vsgs/sgd_2 (an increase of $\Delta 2'''=\Delta 2*rsg$) just after t7, and from Vsgs/sgd_2 to Vsgs-sgd_max (an increase of $\Delta 3'''=\Delta 3*rsg$) just after t9. Once Vwlds0/wldd0_peri is raised to Vpg_max at t6, Vwlds0/wldd0_array begins floating just after t6 so that it is coupled up by the second and third sources of capacitive coupling but not the first source of capacitive coupling. Instead, Vwlds0/wldd0_array is driven at, e.g., 0.5 V, during the first source of capacitive coupling. Specifically, Vwlds0/wldd0_array is coupled up from Vpg_max-Vt to Vwlds0/wldd0_1 (an increase of $\Delta 2''=\Delta 2*rwld$) just after t7, and from Vwlds0/wldd0_1 to Vwlds0/wldd0_max (an increase of $\Delta 3''=\Delta 3*rwld$) just after t9.

Once Vwlds1/wldd1_peri is raised to Vpg_max at t8, Vwlds1/wldd1_array begins floating just after t8 so that it is coupled up by the third source of capacitive coupling but not the first and second sources of capacitive coupling. Instead, Vwlds1/wldd1_array is driven at, e.g., 0.5 V, during the first and second sources of capacitive coupling. Specifically, Vwlds1/wldd1_array is coupled up from Vpg_max-Vt to Vwlds1/wldd1_max (an increase of $\Delta 3'=\Delta 3*rwld$) just after t9.

$\Delta 1$ and hence $\Delta 1'''$ and Vsgs/sgd_max can be adjusted by adjusting Verase_1, for a given Verase_max. For example, Vsgs/sgd_max will be higher when Verase_1 is lower. $\Delta 2$ and hence $\Delta 2''$, $\Delta 2'''$ and Vwlds0/wldd0_max can be adjusted by adjusting Verase_2, for a given Verase_max. For example, Vwlds0/wldd0_max will be higher when Verase2 is lower. $\Delta 3$ and hence $\Delta 3'$, $\Delta 3''$, $\Delta 3'''$ and Vwlds1/wldd1_max can be adjusted by adjusting Verase_3, for a given Verase_max. For example, Vwlds1/wldd1_max will be higher when Verase3 is lower.

The increasing of the erase voltage to provide the first source of capacitive coupling (just after t5) occurs before the increasing of the erase voltage to provide the second source of capacitive coupling (just after t7), and before the increasing of the erase voltage to provide the third source of capacitive coupling (just after t9).

In FIGS. 11-15, the various voltages such as Verase_1, Verase_2, Verase_3, Verase_max and Vpg_max, as well the time delays such as $\Delta t$, $\Delta t1$ and $\Delta t2$ can be set by ROM fuse parameters in the memory device. These parameters can be optimized on a chip to achieve maximum W/E endurance. Recall also that these values and voltages and others such as $\Delta 1$, $\Delta 2$, $\Delta 1'$, $\Delta 2'$, $\Delta 1''$ and $\Delta 2''$ are not necessarily the same in the different figures.

In one embodiment, a method is provided for performing an erase iteration (860, 862 and 864) of an erase operation (852) for a set (200, 300) of non-volatile storage elements which is formed on a substrate (140, 600, 900). The set of non-volatile storage elements comprises a string (201, 301) of series-connected non-volatile storage elements between first and second select transistors (202, 216, 302, 318), and the series-connected non-volatile storage elements comprise a first non-user data non-volatile storage element (204, 214, 304, 316) adjacent to the first select transistor (202, 302). The method comprises: (a) increasing an erase voltage (Vp-well) of the substrate to provide a first source of capacitive coupling to a control gate (941, 949) of the first select gate transistor (e.g., a SGD transistor and/or a SGS transistor), while floating a voltage (Vsgs/sgd_array) of the control gate of the first select gate transistor, but not floating a voltage (Vwldd0/wlds0_array) of a control gate (942, 948) of the first non-user data non-volatile storage element; and (b) increasing the erase voltage of the substrate to provide a second source of capacitive coupling up to the control gate of first select gate transistor and to the control gate of the first non-user data non-volatile storage element, while floating the voltage of the control gate of the first select gate transistor and the voltage of the control gate of the first non-user data non-volatile storage element.

In another embodiment, a non-volatile storage system comprises: (a) a set (200, 300) of non-volatile storage elements which is formed on a substrate (140, 600, 900), the set of non-volatile storage elements comprises a string (201, 301) of series-connected non-volatile storage elements between first and second select gate transistors (202, 216, 302, 318), the series-connected non-volatile storage elements comprise a first non-volatile storage element (204, 214, 304, 316) adjacent to the first select gate transistor (202, 302), the first non-volatile storage element comprises a control gate (942, 948) and the first select gate transistor comprises a control gate (941, 949); and (b) a control circuit (510, 512, 514, 516, 530, 550, 560, 565), the control circuit, to perform an erase iteration (860, 862 and 864) of an erase operation (852) for the set of non-volatile storage elements: throughout one time period (t5-t7), provides capacitive coupling from the substrate to the control gate of the first select gate transistor (e.g., a SGD transistor and/or a SGS transistor) and prevents capacitive from the substrate to the control gate of the first non-volatile storage element, and throughout another time period (t7-t8), non-overlapping with the one time period, provides capacitive coupling from the substrate to the control gate of the first select gate transistor and to the control gate of the first non-volatile storage element.

In another embodiment, a method is provided for performing an erase iteration (860, 862 and 864) of an erase operation (852) for a NAND string (201, 301) of non-volatile storage elements which is formed on a substrate (140, 600, 900). The NAND string comprises a string of series-connected non-volatile storage elements between first and second select transistors (202, 216, 302, 318). The series-connected non-volatile storage elements comprise a first non-volatile storage element (204, 214, 304, 316) adjacent to the first select transistor (202, 302). The method comprises: (a) increasing an erase voltage (Vp-well) of the substrate while floating a voltage (Vsgs/sgd_array) of a control gate of the first select gate transistor, and while driving a voltage of the control gate of the first non-volatile storage element; and (b) further increasing the erase voltage of the substrate while floating the voltage of the control gate of the first select gate transistor and the voltage of the control gate of the first non-volatile storage element.

Corresponding methods, systems and computer- or processor-readable storage devices which have executable code for performing the methods provided herein may also be provided.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for performing an erase iteration of an erase operation, comprising:
   in a first time period, increasing an erase voltage of a substrate while floating a voltage of a control gate of a first select gate transistor, driving a voltage of a control gate of a first non-user data non-volatile storage element and driving a voltage of a control gate of a second non-user data non-volatile storage element, wherein the first non-user data non-volatile storage element and the second non-user data non-volatile storage element are in a string of series-connected non-volatile storage elements which is formed on the substrate, the string comprises a plurality of user data non-volatile storage elements, and the first non-user data non-volatile storage element and the second non-user data non-volatile storage element are between the first select gate transistor and the plurality of user data non-volatile storage elements;
   in a second time period after the first time period, increasing the erase voltage of the substrate while floating the voltage of the control gate of the first select gate transistor and the voltage of the control gate of the first non-user data non-volatile storage element and while driving the voltage of the control gate of the second non-user data non-volatile storage element; and
   in a third time period after the second time period, increasing the erase voltage of the substrate while floating the voltage of the control gate of the first select gate transistor, the voltage of the control gate of the first non-user data non-volatile storage element and the voltage of the control gate of the second non-user data non-volatile storage element.

2. The method of claim 1, wherein:
   the voltage of the control gate of the first select gate transistor is capacitively coupled up during the first, second and third time periods by the increasing of the erase voltage of the substrate in the first, second and third time periods, respectively;
   the voltage of the control gate of the first non-user data non-volatile storage element is capacitively coupled up during the second and third time periods by the increasing of the erase voltage of the substrate in the second and third time periods, respectively; and
   the voltage of the control gate of the second non-user data non-volatile storage element is capacitively coupled up during the third time period by the increasing of the erase voltage of the substrate in the third time period.

3. The method of claim 1, wherein:
   the second non-user data non-volatile storage element is between the first non-user data non-volatile storage element and the plurality of user data non-volatile storage elements.

4. The method of claim 3, wherein:
   the first non-user data non-volatile storage element is adjacent to the first select gate transistor and the second non-user data non-volatile storage element is adjacent to the first non-user data non-volatile storage element.

5. The method of claim 1, wherein:
   the voltage of the control gate of the second non-user data non-volatile storage element reaches a peak level in the erase iteration which is greater than a peak level of the voltage of the control gate of the first non-user data non-volatile storage element in the erase iteration.

6. The method of claim 1, wherein:
the voltage of the control gate of the first select gate transistor reaches a peak level in the erase iteration which is greater than a peak level of the voltage of the control gate of the first non-user data non-volatile storage element in the erase iteration; and
the peak level of the voltage of the control gate of the first non-user data non-volatile storage element is greater than a peak level of the voltage of the control gate of the second non-user data non-volatile storage element in the erase iteration.

7. The method of claim 1, wherein:
in the first time period, the voltage of the control gate of the first non-user data non-volatile storage element and the voltage of the control gate of the second non-user data non-volatile storage element are positive voltages; and
in the second time period, the voltage of the control gate of the second non-user data non-volatile storage element is a positive voltage.

8. The method of claim 1, wherein:
the voltage of the control gate of the second non-user data non-volatile storage element is fixed at a same positive voltage in the first time period and in the second time period.

9. The method of claim 1, wherein:
one user data non-volatile storage element among the plurality of user data non-volatile storage elements is closest to the second non-user data non-volatile storage element; and
a voltage of a control gate of the one user data non-volatile storage element is driven throughout the first time period, the second time period and the third time period.

10. The method of claim 1, wherein:
the string of series-connected non-volatile storage elements comprises a drain-side and a source-side; and
the first select gate transistor, the first non-user data non-volatile storage element and the second non-user data non-volatile storage element are at the drain-side.

11. The method of claim 1, wherein:
the increasing of the erase voltage during at least one of the first, second or third time periods comprises a step increase.

12. The method of claim 1, wherein:
the increasing of the erase voltage during at least one of the first, second or third time periods comprises a ramp increase.

13. A non-volatile storage system, comprising:
a string of series-connected non-volatile storage elements which is formed on a substrate, the string comprises a plurality of user data non-volatile storage elements;
a first select gate transistor comprising a control gate;
a first non-user data non-volatile storage element comprising a control gate;
a second non-user data non-volatile storage element comprising a control gate, wherein the first non-user data non-volatile storage element and the second non-user data non-volatile storage element are between the first select gate transistor and the plurality of user data non-volatile storage elements; and
a control circuit, the control circuit, to perform an erase iteration of an erase operation for the plurality of user data non-volatile storage elements, is configured to:
in a first time period, increase an erase voltage of the substrate, float a voltage of the control gate of the first select gate transistor, drive a voltage of the control gate of the first non-user data non-volatile storage element and drive a voltage of the control gate of the second non-user data non-volatile storage element;
in a second time period after the first time period, increase the erase voltage of the substrate, float the voltage of the control gate of the first select gate transistor and the voltage of the control gate of the first non-user data non-volatile storage element and drive driving the voltage of the control gate of the second non-user data non-volatile storage element; and
in a third time period after the second time period, increase the erase voltage of the substrate, and float the voltage of the control gate of the first select gate transistor, the voltage of the control gate of the first non-user data non-volatile storage element and the voltage of the control gate of the second non-user data non-volatile storage element.

14. The non-volatile storage system of claim 13, wherein:
the voltage of the control gate of the first select gate transistor is capacitively coupled up during the first, second and third time periods by the increasing of the erase voltage of the substrate in the first, second and third time periods, respectively;
the voltage of the control gate of the first non-user data non-volatile storage element is capacitively coupled up during the second and third time periods by the increasing of the erase voltage of the substrate in the second and third time periods, respectively; and
the voltage of the control gate of the second non-user data non-volatile storage element is capacitively coupled up during the third time period by the increasing of the erase voltage of the substrate in the third time period.

15. The non-volatile storage system of claim 14, wherein:
the second non-user data non-volatile storage element is between the first non-user data non-volatile storage element and the plurality of user data non-volatile storage elements.

16. The non-volatile storage system of claim 15, wherein:
the first non-user data non-volatile storage element is adjacent to the first select gate transistor and the second non-user data non-volatile storage element is adjacent to the first non-user data non-volatile storage element.

17. The non-volatile storage system of claim 14, wherein:
the voltage of the control gate of the second non-user data non-volatile storage element reaches a peak level in the erase iteration which is greater than a peak level of the voltage of the control gate of the first non-user data non-volatile storage element in the erase iteration.

18. The non-volatile storage system of claim 14, wherein:
the voltage of the control gate of the first select gate transistor reaches a peak level in the erase iteration which is greater than a peak level of the voltage of the control gate of the first non-user data non-volatile storage element in the erase iteration; and
the peak level of the voltage of the control gate of the first non-user data non-volatile storage element is greater than a peak level of the voltage of the control gate of the second non-user data non-volatile storage element in the erase iteration.

19. The non-volatile storage system of claim 14, wherein:
in the first time period, the voltage of the control gate of the first non-user data non-volatile storage element and the voltage of the control gate of the second non-user data non-volatile storage element are positive voltages; and in the second time period, the voltage of the control gate of the second non-user data non-volatile storage element is a positive voltage.

20. The non-volatile storage system of claim 14, wherein:
the voltage of the control gate of the second non-user data non-volatile storage element is fixed at a same positive voltage in the first time period and in the second time period.

* * * * *